United States Patent [19]
Yamazaki et al.

[11] Patent Number: 5,929,464
[45] Date of Patent: *Jul. 27, 1999

[54] ACTIVE MATRIX ELECTRO-OPTICAL DEVICE

[75] Inventors: Shunpei Yamazaki, Tokyo; Jun Koyama; Yasuhiko Takemura, both of Kanagawa, all of Japan

[73] Assignee: Semiconductor Energy Laboratory Co., Ltd., Kanagawa-ken, Japan

[*] Notice: This patent is subject to a terminal disclaimer.

[21] Appl. No.: 08/588,809

[22] Filed: Jan. 19, 1996

[30] Foreign Application Priority Data

Jan. 20, 1995 [JP] Japan ................................. 7-026188
Jan. 28, 1995 [JP] Japan ................................. 7-031563
Jul. 31, 1995 [JP] Japan ................................. 7-215407

[51] Int. Cl.$^6$ ................. H01L 29/04; H01L 29/786; H01L 31/0392
[52] U.S. Cl. ................................. 257/72; 257/67
[58] Field of Search ........................... 257/67, 72

[56] References Cited

U.S. PATENT DOCUMENTS

| | | | |
|---|---|---|---|
| 4,938,565 | 7/1990 | Ichikawa | 359/59 |
| 4,990,981 | 2/1991 | Tanaka et al. | 359/59 |
| 5,173,792 | 12/1992 | Matsueda | 359/59 |
| 5,182,620 | 1/1993 | Shimada et al. | 257/72 |
| 5,208,690 | 5/1993 | Hayashi et al. | 257/347 |
| 5,365,079 | 11/1994 | Kodoma et al. | 257/59 |
| 5,367,392 | 11/1994 | Janai | 257/72 |
| 5,410,164 | 4/1995 | Katayama | 257/72 |
| 5,412,493 | 5/1995 | Kunii | 257/72 |
| 5,515,187 | 5/1996 | Nakamura et al. | 359/59 |
| 5,576,556 | 11/1996 | Takemura | 257/72 |
| 5,608,557 | 3/1997 | Wu | 257/72 |
| 5,614,733 | 3/1997 | Zhang | 257/72 |
| 5,650,636 | 7/1997 | Takemura | 257/72 |

FOREIGN PATENT DOCUMENTS

| | | | |
|---|---|---|---|
| 62-92370 | 4/1987 | Japan . | |
| 5-265042 | 10/1993 | Japan | 359/59 |
| 6-82758 | 3/1994 | Japan | 359/59 |

*Primary Examiner*—Jerome Jackson, Jr.
*Attorney, Agent, or Firm*—Sixbey, Friedman, Leedom & Ferguson, P.C.; Eric J. Robinson

[57] ABSTRACT

In an active matrix display unit, a plurality of thin-film transistors are connected in series for one pixel electrode as a switching element, and at least one of the thin-film transistors connected in series except for thin-film transistors at both ends thereof is always made in an on-state, to thereby constitute a resistance component and a capacitance component between the thin-film transistors connected in series with the result that a leak current when the switching element is off is reduced.

30 Claims, 12 Drawing Sheets

IN BROKEN LINE: UNIT PIXEL

ACTIVE MATRIX ELECTRO-OPTICAL DEVICE

BACKGROUND OF THE INVENTION

1. Field of the Invention

The present invention relates to a circuit and an element, which improve an image quality of a display screen in an active matrix display unit, and more particularly to a circuit and a device in which a circuit having a thin-film transistor (TFT) is used as a switching element, and an active layer of the TFT is comprised of a silicon semiconductor which has been crystallized using a catalyst element that promotes the crystallization of amorphous silicon.

2. Description of the Related Art

The active matrix display unit is directed to a display unit which is structured in such a manner that a switching element is provided for each of pixels, and a signal which is supplied through a video signal line is supplied to each of pixels by the switching element, thereby being capable of performing a distinct display of a larger capacitance than that of a simple matrix display unit. Up to now, a TFT using an amorphous silicon semiconductor has been used as a switching element. However, the operating speed of the TFT using a crystalline silicon semiconductor is at least ten times as high as that of the TFT using a conventional amorphous silicon semiconductor with the result that it is proper for a large-capacitance display and has been recently developed from this viewpoint. However, the crystalline silicon semiconductor has suffered from several problems.

A first problem resides in the crystallization of silicon. The crystalline silicon is obtained by crystallizing amorphous silicon. Two conventional methods have been known for crystallizing amorphous silicon, one of which is a method of crystallizing amorphous silicon with the irradiation of a laser beam or the like in a moment, which is called an optical annealing. This method suffers from such a problem that the reproducibility and the mass-productivity are poor because a laser oscillator having a stabilized large energy is not obtained.

Another method is called a thermal annealing technique or a solid-phase growing technique, which conducts thermal annealing usually at a temperature of 600° C. or higher, to grow amorphous silicon in a solid phase, thereby crystallizing amorphous silicon. In the method, a period of time required for crystallization depends on an annealing temperature, and crystallization has been finished within one hour at a high temperature of the degree of 1000° C. However, a substrate which is useful to such a high temperature is made of nothing other than quartz, which leads to an increase in the costs of the substrate. Also, the crystallization of the silicon film obtained is not excellent.

On the contrary, in the annealing at about 600° C. that enables a lot of boro-silicate glasses to be used, a silicon film which is excellent in crystallization is obtained, however, a period of time required for crystallization is 24 hours or more, which leads to a problem from the viewpoint of the mass productivity.

A second problem resides in that a leak current (off-state current) becomes large when a reverse bias voltage is applied to a gate electrode in the TFT using crystalline silicon. This is considered to be caused by a grain boundary, and is of a most serious problem in the manufacturing of the active matrix display unit using crystalline silicon.

In the case of an n-channel TFT, an off-state current when $V_{GS}$ is biased negatively is regulated by a current that flows in a p-n junction which is formed between a p-type layer which is induced on the surface of a semiconductor thin film and a n-type layer in a source region and a drain region. Because a lot of traps exist in the semiconductor thin film (in particular, grain boundary), the p-n junction is incomplete to the degree that a junction leak current is liable to flow thereinto. The off-state current is increased as the gate electrode is biased negatively. This is because the carrier density of the p-type layer formed on the surface of the semiconductor thin film is increased so that an energy barrier of the p-n junction is narrowed in width, with the results that an electric field is concentrated and the junction leak current is increased.

The off-state current thus produced greatly depends on a source-to-drain voltage. For example, there has been known that the off-state current is actively increased as a voltage applied between the source and the drain of the TFT becomes large. In other words, comparing a case where a voltage of 5 V is applied between the source and the drain with a case in which a voltage of 10 V is applied therebetween, the off-state current of the latter may not be twice as large as that of the former, but may be ten times or 100 times. Also, such a non-linearly depends on the gate voltage. In general, when the value of the reverse bias of the gate electrode is large (a large minus voltage in the n-channel type), a difference between the former and the latter is remarkable.

As to the above-mentioned first problem, the inventors have found that the crystallization of amorphous silicon can been promoted by the addition of a little amount of nickel, platinum, iron, cobalt, palladium, etc., (Japanese Patent Unexamined Publication No. Hei 6-244104). Those elements to be added is called a catalyst element, and as a result, the crystallization could be performed through thermal annealing typically at 550° C. for four hours or at a lower temperature for a less period of time. In addition, in the conventional thermal annealing technique, amorphous silicon having a thickness of less than 1000 Å could be hardly crystallized. However, there has been found that using the catalyst element enables even amorphous silicon having a thickness of less than 1000 Å, typically 300 to 800 Å to be satisfactorily crystallized.

As a result of the research conducted by the inventors, it has been found that, in the case of manufacturing the TFT using silicon which has been crystallized using those catalyst elements, the residual density of the catalyst elements in silicon is preferably set to $1\times10^{15}$ to $1\times10^{19}$ atoms/cm$^3$ from the viewpoints of the crystallizing process, the characteristic and the reliability.

The first problem has been solved in this way. However, the second problem remains unsolved. Inversely, the crystal growth of the silicon film which has been crystallized using the catalyst element progresses in the form of a needle (in the conventional thermal annealing technique, it is in the form of a grain), and the length of the crystal is large to the degree of several μm or more (in the conventional thermal annealing technique, it is 1 μm or less). For that reason, there newly arises such a problem that TFT characteristic is largely effected by the grain boundary of the crystal, and the dispersion of an off-state current is large. The off-state current has been typically dispersed three figures of from 1000 pA to 1 pA.

FIG. 2A is a schematic diagram showing a conventional example of an active matrix display unit. A region 204 surrounded by a broken line in the figure represents a display region in which a TFT 201 is arranged in the form of a matrix. A wiring connected to the source electrode of the TFT 201 represents an image data signal line 206, and a wiring connected to the gate electrode of the TFT 201 represents a line select signal line 205.

The drive principle of that circuit is that a line is selected by inputting pulses to the respective line select signal lines of a N-th line, a (N+1)th line and a (N+2)th line while shifting a timing of inputting the pulse bit by bit as shown in FIG. 12.

In the circuit shown in FIG. 2A, the switching element is comprised of the TFT 201 and conducts the switching operation of data in accordance with a signal from the line select signal line 205 to thereby drive a liquid-crystal cell 203. An auxiliary capacity 202 is comprised of a capacity for reinforcing the capacitance of the liquid-crystal cell and is used for holding image data. For the purpose of uniformly displaying over the entire surface of the matrix, it is necessary to unify the characteristics of all the TFTs. More particularly, it is required that the off-state current is 10 pA or less, preferably 1 pA or less. If the TFT has the off-state current of 1000 pA, sufficient charges cannot be held, and a video signal becomes lost in a moment.

If the number of the above-mentioned defective TFTs is several in all the pixels, there arises no problem. However, if the number of the defective TFTs is several % of all the pixels, it is very hard to view the display. In particular, this phenomenon is remarkable in the TFT using a crystalline silicon obtained with a catalyst element as described above.

In order to solve this problem, for example, there has been proposed a method (multi-gate technique) of connecting TFTs in series as disclosed in Japanese Patent Examined Publication No. Hei 5-44195 and Japanese Patent Examined Publication No. Hei 5-44196. This method is intended to decrease the off-state current of the respective TFTs by reducing a voltage applied to the sources and drains of the respective TFTs. For example, in the case of connecting two TFTs in series as shown in FIG. 2B, a voltage applied to the sources and drains of the respective TFTs is made half. If the voltage applied to the sources and drains is made half, the off-state current becomes $1/10$, $1/100$ or the like as described above.

However, because the characteristic required for the image display of the liquid-crystal display unit became strict, it became hard to lower the off-state current as required even in the above-mentioned multi-gate technique. In other words, even though the number of gate electrodes (the number of transistors) is increased to three, four and five, the voltage applied to the sources and drains of the respective TFTs is reduced bit by bit to the degree of $1/3$, $1/4$ and $1/5$. In order to make the voltage applied to the sources and drains $1/100$, 100 gates have been required.

In other words, in the above-mentioned system, the effect is most remarkable when the number of gates is two. However, even though the number of gates is increased more than two, more effect could not be expected. In particular, in the TFT using a silicon film which has been crystallized with a catalyst element, as described above, the very large off-state current appears at a very high frequency. However, the above TFT was not useful to sufficiently cancel that influence.

SUMMARY OF THE INVENTION

The present invention has been made in view of the above-mentioned problems, and an object of the present invention is to provide a pixel circuit with a structure which reduces the off-state current by setting a voltage applied to the sources and drains of TFTs connected to a pixel electrode to $1/10$ or less, or more preferably $1/100$ or less of the usual voltage. In this case, the characteristic feature is that the number of the TFTs is sufficiently reduced. The number of the TFTs is preferably 5 or less, and more preferably 3 to thereby achieve the above-mentioned object.

In other words, in order to solve the above-mentioned problems, the present invention has been achieved by the provision of an active matrix circuit in which a circuit where at least three TFTs are connected in series to one pixel electrode, and at least one of said TFTs connected in series except for TFTs connected to an image signal line is always or almost always in an on-state is used as a switching element. In the present invention, the active layer of the TFT is made of crystalline silicon and contains a catalyst element which promotes the crystallization of silicon at $1 \times 10^{15}$ to $1 \times 10^{19}$ atoms/cm$^3$, or the active layer of the TFT is crystallized using a catalyst element.

In the above-mentioned active matrix circuit, the other end of the TFTs connected in series may be connected to a pixel element. Also, the gate electrode of the TFTs connected in series may be used commonly except for a TFT which is always in the on-state. It is needless to say that the respective gate electrodes may be driven independently, but the former is advantageous from the viewpoint of the integrated degree. Further, an LDD region or an offset region may be provided to both ends of the channel of the TFT which is connected to the pixel electrode in the above-mentioned TFTs.

The fundamental concept of the present invention is characterized in that three or more TFTs are connected, and at least one TFT positioned at the center thereof is always made in an on-state by applying a constant voltage to the gate electrode, or is made in the on-state for almost all times where other TFTs are in an off-state.

In an example of FIG. 1A, of TFTs 103, 104 and 105 connected in series, the TFT 103 has a source connected to an image signal line 101, and the TFT 104 has a drain connected to a pixel electrode 106. The gate electrodes of the TFTs 103 and 104 are controlled by a line select signal line 102.

Then, a proper positive voltage is always applied to the gate electrode of the TFT 105 positioned at the center from a power source 107 to provide an on-state. As occasion demands, an auxiliary capacity 108 may be added in parallel to the pixel cell 106.

In the circuit diagram shown in FIG. 1A, an arrangement in the vicinity of the gate electrodes of the TFTs 103, 104 and 105 is shown in FIG. 1D. Since a method of manufacturing this circuit will be described in an embodiment with reference to FIG. 4, only its outline will be described here. In the circuit, three TFTs 103, 104 and 105 (their conceptual regions are indicated by broken lines) are formed on one silicon semiconductor film (active layer), and the gate electrodes 405, 407 and 406 of the respective TFTs are disposed so as to be transverse to the corresponding TFTs. Then, in the semiconductor region, an image signal line is connected to a left-end region 411 (=the source of the TFT 103), and a pixel electrode is connected to a right-end region 414 (=the drain of the TFT 104), respectively.

The equivalent circuit of the circuit shown in FIG. 1A is shown in FIG. 2C. The same symbols as those in FIG. 1C designate the like members, and the TFT 105 is equivalently represented as a coupling of a substantially static capacitance component 221 to a resistance component 222. Those capacitance and resistance components 221 and 222 strictly fluctuate in accordance with the fluctuation of the potential of the source and drain of the TFT 105. As far as the gate potential is held to an appropriate value, such a fluctuation can be ignored. The capacitance component 221 and the resistance component 222 strictly have a distributed parameter circuit construction, but a circuit construction shown in FIG. 2C will be described hereinafter because of no substantial problem.

A specific operation will be described. When a select signal is transmitted to the line select signal line 102, both of the TFT 103 at the image signal line 101 side and the TFT 104 at the pixel cell 106 side are turned on. On the other hand, in the center TFT 105, the capacitance component 221 and the pixel cell 106 are charged in accordance with a signal from the image signal line 101. In a stage where charging has been sufficiently made (balanced), a voltage between the source and the drain of the TFT 104 at the pixel cell 106 side becomes in a nearly equal state.

In this state, when the select signal of the line select signal line 102 is interrupted, both of the TFT 103 at the image signal line 101 side and the TFT 104 at the pixel cell 106 side are turned off. Thereafter, another pixel signal is applied to the image signal line 101, and since the TFT 103 at the image signal line 101 side has a limited off-state current, the charge which has been charged in the capacitance component 221 formed in the center TFT 105 is discharged, to thereby lower the voltage. However, this speed progresses at the same speed as the voltage drop of the capacity 202 of the usual active matrix circuit shown in FIG. 2A.

On the other hand, the TFT 104 of the pixel electrode side initially has a very slight off-state current because a voltage between the source and the drain is substantially zero, but thereafter a voltage between the source and the drain is gradually increased because a voltage of the capacitance component 221 of the center TFT 105 drops, thereby increasing the off-state current. However, it is needless to say that a voltage drop of the pixel cell 106 due to an increase of that off-state current is sufficiently slower than that in the usual active matrix circuit shown in FIG. 2A. Also, since the resistance component 222 exists in the center TFT 105, it has an effect that the off-state current is more reduced.

In this way, it has the effect that the off-state current can be reduced in average. However, according to the present invention, the rate of generating the switching element having a large off-state current can be largely reduced. For example, in FIG. 1A, even though one of the TFTs 103 and 104 has a remarkably large off-state current, if the other is normal, the off-state current restraint effect is exhibited as a whole. In other words, a possibility that both of the TFTs 103 and 104 have remarkably large off-state current, that is, they are defective, is very low. As a result, the off-state current is 1 pA or less for 99% of the switching element TFTs, and is 10 pA or less for 99.99% of the switching element TFTs. Thus, the rate of generating the switching element having the off-state current of 10 pA or more which gives an image a fault could be made 1 ppm or less.

In particular, when the off-state current of the TFT 104 is large, the capacity of the TFT 105 exhibits the same operation as that of the auxiliary capacity 202 in FIG. 2A so that the charge holding capability of a pixel can be maintained.

It should be noted that if an LDD region or an offset region is formed in the channels of the TFTs 103 and 104, those regions are made a drain resistor and a source resistor with the results that the electric field intensity of the drain junction is relieved to further reduce the off-state current. In particular, it is effective that an LDD (low density doping) region or an offset region is formed on both ends of the channel of the TFT 104 at a pixel electrode side.

For example, it is assumed that the TFT 201 shown in FIG. 2A and the TFT 103 shown in FIG. 2C have the characteristics of the same degree, and a voltage across the capacities 202 and 108 is changed from an initial 10 V to 9 V of 90% for one frame, respectively. In the case of FIG. 2A, a voltage across the pixel cell 203 drops to 9 V for one frame. However, in the case of FIG. 2C, even though a voltage across the capacity 221 drops to 9 V, a voltage between the source and the drain of the TFT 103 is 1 V. Accordingly, the off-state current is very small, and an accumulated charge amount discharged from the pixel cell 106 and the capacity 221 is extremely small because of the end time of one frame, as a result of which a voltage across the pixel cell 106 is hardly changed and remains 10 V.

Comparison with the case of FIG. 2B is not simple, but, in FIG. 2B, a voltage applied to the source and drain of one TFT is 5 V which is half of 10 V in the case of FIG. 2A, and there is no possibility that a voltage between the source and the drain is 1 V as in the case of the TFT 104 shown in FIG. 2C. Hence, the excellence of the present invention is exhibited from this viewpoint likewise.

In the example of FIG. 1A, the center TFT 105 has the same conduction type (in this case, the n-channel type) as that of the TFTs 103 and 104 at both ends thereof. However, as in FIG. 1B, a TFT 111 having the reverse conduction type (that is, the p-channel type) may be arranged. It should be noted that a voltage applied to the gate electrode of the center TFT 111 is opposite in polarity to that in the case of FIG. 1A.

Also, more TFTs may be connected in series to form a circuit. For example, as shown in FIG. 1C, five TFTs 121 to 125 of the same conduction type may be connected in series. The gate electrodes of the TFTs 122 and 124 are connected with power sources 126 and 127 in order to hold the TFTs 122 and 124 in the on-state at all times. The equivalent circuit of FIG. 1C is shown in FIG. 2D. The TFTs 122 and 124 are represented as a connecting circuit of capacitance components 221 and 223 and resistance components 222 and 224, respectively. In the case of FIG. 1C, because five TFTs are used in total, the off-state current reduction effect is further increased more than that in the case of using three TFTs. However, if the number of the TFTs as used is increased to seven, nine . . . , the off-state current reduction effect is not increased so much. The number of the TFTs as used is preferably 5 or less in view of the circuit construction, etc.

It should be noted that the circuits shown in FIGS. 1A to 1C have such a structure that the TFTs at both ends of the TFTs connected in series are connected to the line select signal line 102. Among them, the TFT connected to the pixel electrode may be always or almost always in the on-state. For example, it may be of a circuit from which the TFT 125 shown in FIG. 1C is removed. Such a circuit is so designed as to add a capacity of the TFT between the pixel electrode and the TFT 104 of the circuit shown in FIG. 1A, and that TFT corresponds to the auxiliary capacity 108.

Furthermore, in order to restrain the voltage effect of the pixel cell, another aspect of the present invention has been achieved by the provision of an active matrix circuit in which a circuit where at least three TFTs are connected in series to one pixel electrode, and at least one TFT except for both ends of said TFTs connected in series is controlled in accordance with a signal line (hereinafter referred to as "gate signal line") that supplies a signal independent from the line select signal line, and other TFTs are controlled in accordance with the line select signal line, is used as a switching element.

Here, that a signal of the gate signal line is independent from a signal of the line select signal line means that it is not the same as the signal of the line select signal line, and the signal may be in some synchronism with the signal of the line select signal line. In general, it may be a signal supplied from another circuit which is different from a circuit (line select signal circuit) that supplies a signal of the line select signal line, and said circuit may process a signal generated from the line select signal circuit or a signal inputted to the line select signal circuit.

In addition, according to the present invention, the active layer of the TFT is constituted by the crystalline silicon and contains a catalyst element that promotes the crystallization of silicon at $1\times10^{15}$ to $1\times10^{19}$ atoms/cm$^3$ therein, or the active layer of the TFT is crystallized using a catalyst element.

Here, one end of the TFTs connected in series may be connected to the image signal line, and the other end thereof may be connected to the pixel electrode. Further, an LDD region or an offset region may be disposed on both ends of a channel of the TFT connected to the pixel electrode among the above-mentioned TFTs.

The fundamental concept of the present invention is characterized in that three or more TFTs are connected, and at least one TFT positioned at the center thereof has its gate electrode connected to another gate signal line which is different from the line select signal line, to thereby drive the TFT by a signal from said signal line.

In an example of FIG. 10A, of TFTs 153, 154 and 155 connected in series, the TFT 153 has its source connected to an image signal line 151, and also the drain of the TFT 154 is connected to a pixel electrode 156. The gate electrodes of the TFTs 153 and 154 are controlled by the line select signal line 152.

Then, the gate electrode of the center TFT 155 is connected to a gate signal line 157, and the TFT 155 is driven independently from the TFTs 153 and 154 connected to the line select signal line 152, whereby charges are held in a pixel cell 156 in a state where the TFTs 153 and 154 are off. It should be noted that an auxiliary capacity 158 may be added in parallel to the pixel cell 156.

Of the circuit diagram shown in FIG. 10A, the circuit arrangement in the vicinity of the gate electrodes of the TFTs 153, 154 and 155 is constituted as shown in FIG. 1D, as in that of FIG. 1A.

BRIEF DESCRIPTION OF THE DRAWINGS

The above and other objects and features of the present invention will be more apparent from the following description taken in conjunction with the accompanying drawings.

DETAILED DESCRIPTION OF THE PREFERRED EMBODIMENTS

Figure 1A:
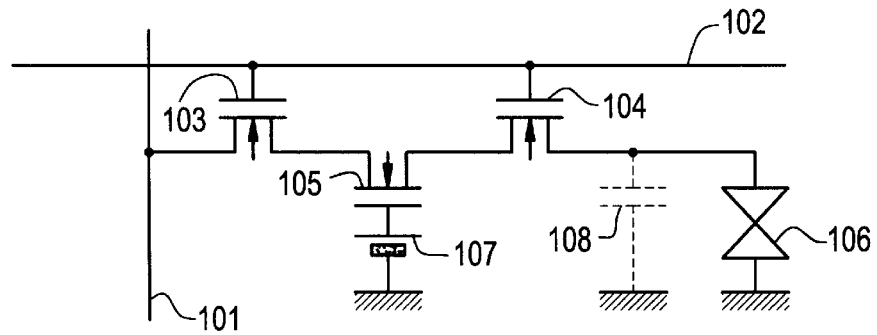
FIGS. 1A to 1D show examples of a switching element in an active matrix circuit in accordance with the present invention.
Figure 1B:
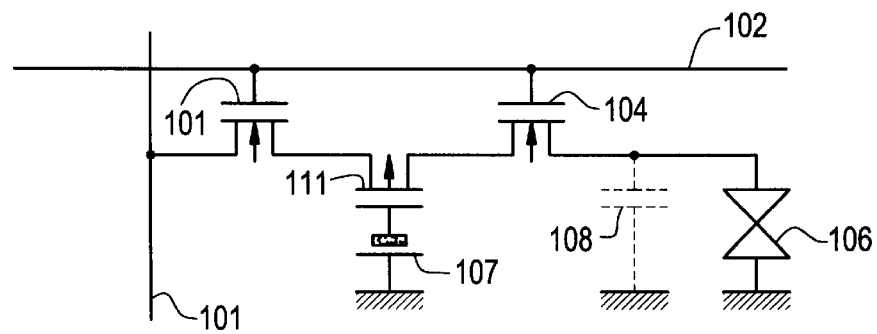

A description will be given of embodiments of the present invention with reference to the accompanying drawings.
First Embodiment In a first embodiment, an operating example of FIG. 1A will be described. All of TFTs 103 to 105 are of the n-channel type, but they may be of the p-channel type, likewise. Rather, the thin-film transistor using a crystalline silicon semiconductor obtained with a catalyst element has such a characteristic that the TFT of the p-channel type is smaller in the off-state current than the TFT of the n-channel type, thereby making it hard to deteriorate the TFT.

The two thin-film transistors 103 and 104 commonly use the wiring of the gates and are connected to a line select signal line 102. Also, the source of the TFT 103 is connected to an image signal line 101. A TFT 105 which is normally in an on-state is connected between the two TFTs 103 and 104. In order to always hold the TFT 105 in the on-state, it is desirable that a positive potential which is sufficiently high to the extent that it is hardly effected by an image signal, etc., is given to the gate by the power source 107.

For example, when the image signal fluctuates between −5 V and +5 V, the gate of the TFT 105 is +8 V or more, preferably is always held to a potential of +10 V or more. For example, if the potential of the gate of the TFT 105 is +6 V, then a potential difference between the gate and the source fluctuates between +1 and +11 V which is in the vicinity of a threshold voltage of the TFT, and the capacitance obtained by the TFT 105 largely fluctuates upon an influence of the image signal. On the other hand, if the potential of the gate of the TFT 105 is +10 V, a potential difference between the gate and the source fluctuates between +5 and +15 V. However, since it is sufficiently apart from the threshold voltage, the capacitance obtained in the TFT 105 hardly fluctuates.

A liquid-crystal cell 106 (and an auxiliary capacity 108 as occasion demands) is connected to the drain of the TFT 104. Then, the other end of the liquid-crystal cell 106 (and the auxiliary capacity 108) may be connected to a ground level. It should be noted that the capacitance of the MOS capacity of the TFT 105 may be determined to an optimum value in accordance with a ratio of that capacitance to the capacitance of the liquid-crystal cell 105 (and the sum of the capacitance of the liquid-crystal cell 105 and the capacitance of the auxiliary capacity 108 as occasion demands).

The operation of the switching element shown in FIG. 1A will be described. First, a voltage of an "H" level is applied to the gates of two TFTs 103 and 104 so that the TFTs 103 and 104 becomes in an on-state. Then, a current corresponding to an image signal flows in the source of the TFT 103, and at this time, the center TFT 105 mainly functions as a capacity and starts charging operation. Simultaneously, because the TFT 105 is always in the on-state, a current flows into the drain from the source of the TFT 104, thereby charging the liquid-crystal cell 106.

Subsequently, after a voltage of an "L" level is applied to the gate of the TFTs 103 and 104, the TFTs 103 and 104 turn off so that a voltage across the source of the TFT 103 drops, and the off-state current flows in the charges stored in the TFT 105 which is always in the on-state, to thereby start the discharge operation. However, a voltage drop between the drain and the source of the thin-film transistor which is connected to a pixel is delayed with the capacitance of the TFT 105. Also, the off-state current is reduced even by the resistance component of the TFT 105. With the above-mentioned effect, the charges in the liquid-crystal cell 106 is slowly reduced, and a voltage across the liquid-crystal cell 106 drops until the TFT becomes in the on-state in the next screen.

Figure 2A:
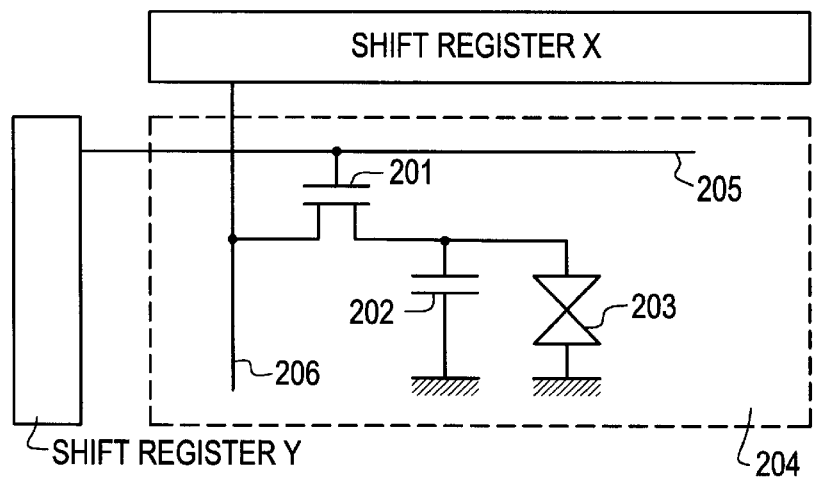
FIGS. 2A to 2D show circuit diagrams and equivalent circuits of the switching elements in an active matrix circuit in the prior art and in the present invention.
Figure 2B:
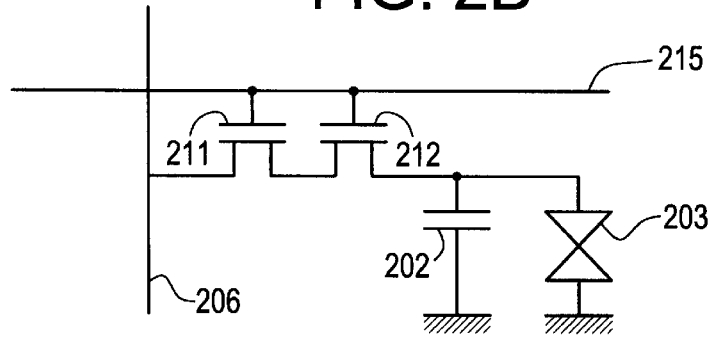

In FIG. 1A, let us consider a circuit from which an normally on-state n-channel TFT 105 is deleted. Two n-channel TFTs 103 and 104 commonly use the wiring of their gates, and liquid-crystal cell 106 is connected to the drain of the TFT 104. This is a so-called multi-gate type circuit shown in FIG. 2B.

First, a voltage of the "H" level is applied to the gate electrode of the two TFTs 103 and 104 so that the TFTs turn on. Then, a current flows in the sources of the TFTs to thereby charge the liquid-crystal cell 106.

Subsequently, a voltage of the "L" level is applied to the gates of the TFTs 103 and 104 so that the TFTs turn off, and a voltage across the source of the TFT 103 drops with the result that a voltage across the drain of the TFT 104 also drops. Accordingly, the liquid-crystal cell 106 starts the discharge operation. However, a voltage drop is larger than that in FIG. 1A because of no capacitance component and no resistance component between those two TFTs.

Second Embodiment

In a second embodiment, a specified operation of the circuit shown in FIG. 10A will be described with reference to FIG. 11. FIG. 11A shows the entire active matrix circuit in accordance with the present invention as in FIG. 12A, and reference numerals used therein are identical to those in FIG. 10A. A line select signal line 152 is supplied with a signal through a shift register Y as in the conventional circuit (FIG. 12). A gate signal line 158 added in accordance with the present invention is supplied with a signal through another shift register Z (or an equivalent circuit).

Figure 11A:
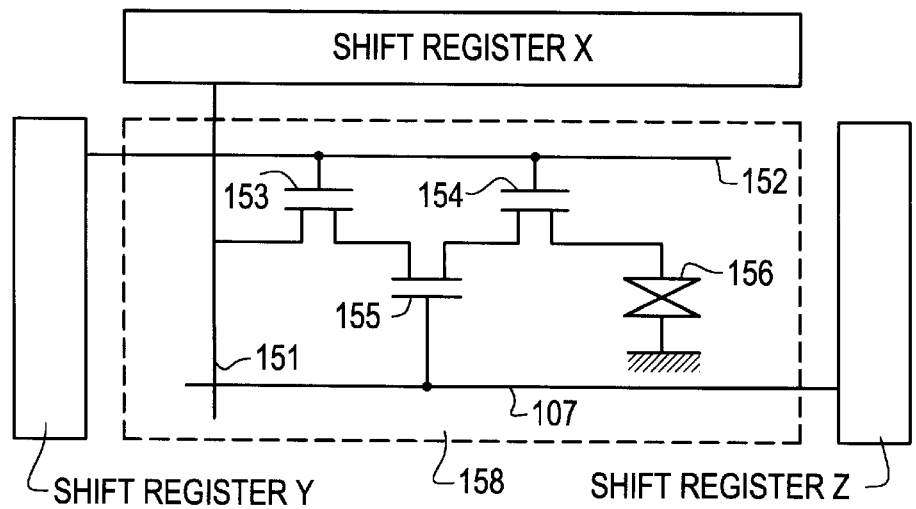
FIGS. 11A and 11B show the circuit diagram and the operating example of a switching element in an active matrix circuit in accordance with the present invention.
Figure 11B:
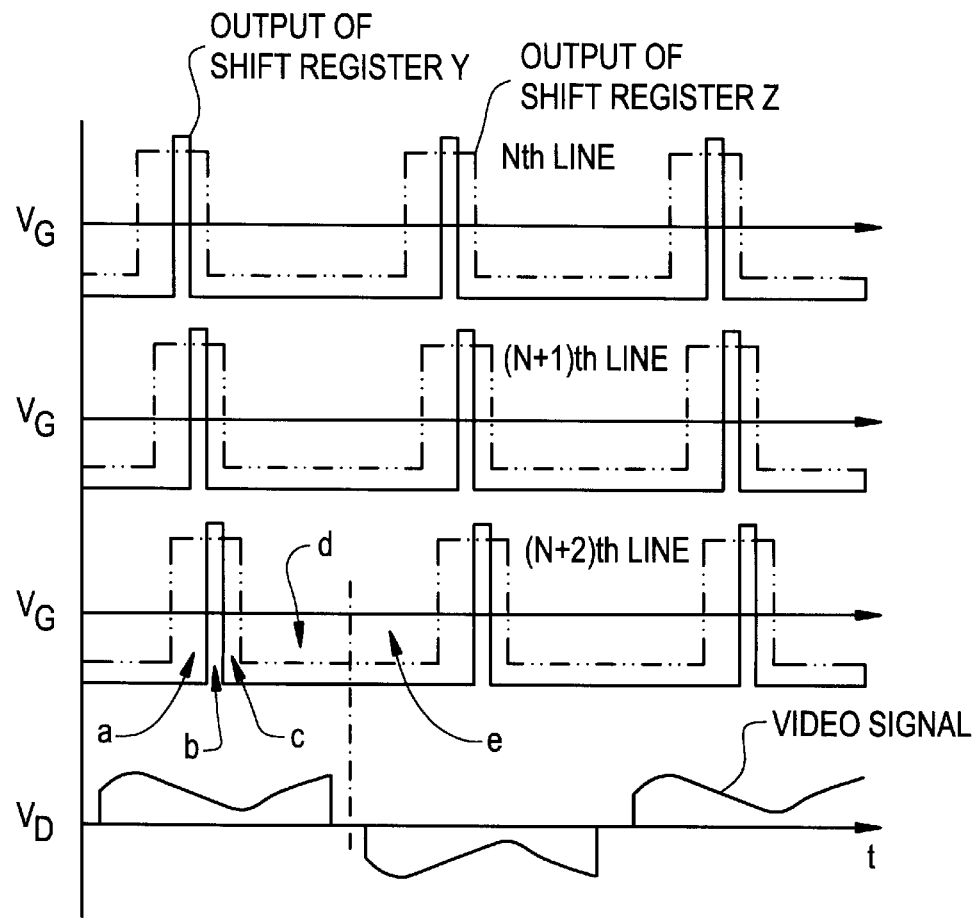
Figure 12:
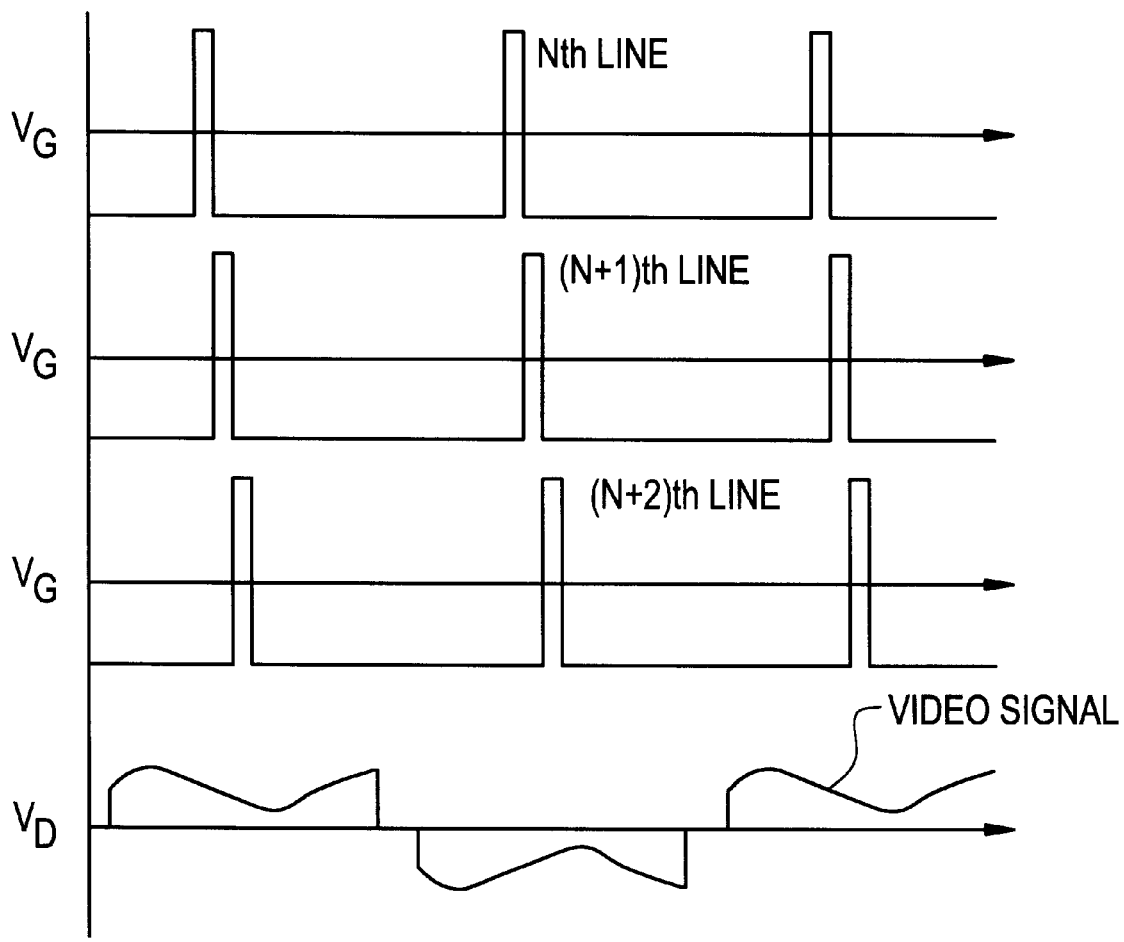
FIG. 12 shows an operating example of a switching element in a conventional active matrix circuit.

A signal applied to the line select signal line 151 and the gate select signal line 158 is shown in FIG. 11B. In other words, pulses are inputted to the respective line select signal lines 151 of an N-th line, an (N+1)th line and an (N+2)th line, while shifting a timing of inputting the pulses, as in the conventional circuit.

On the other hand, a signal is applied to the respective gate signal line 158 of the N-th line, the (N+1)th line and the (N+2)th line, likewise. It is convenient to superimpose those pulses to each other to some degree or to synchronize those pulses with the pulse of each line select signal line. In the case where the gate capacitance of the TFT 155 is large in comparison with the TFTs 153 and 154, the pulse width may be preferably made larger than the pulse of the line select signal line 151, as shown in FIG. 11B.

An example of the operation will be described with reference to FIG. 11B. It is needless to say that the operation other than that operation can also be performed. Attention is drawn to the (N+2)th line. First a pulse is applied to the gate signal line 158, and the center TFT 155 turns on. In this situation, video data for another line is applied to the image signal line 151. However, the line select signal line is held to a negative potential, and the TFTs 153 and 154 at both sides of the TFT 155 are in the off-state. In this situation, data is not taken in the pixel cell 156 (period a in FIG. 11B).

After this state continues for a while, the potential of the line select signal line 151 for the (N+2)th line is converted positively. In this situation, the discharge of the pixel cell 156 and the charge of data of the image signal line 151 are conducted for the first time. Here, charging is conducted at a positive voltage, and all of the TFTs 153 to 154 are in the on-state (period b in FIG. 11B).

Subsequently, the potential of the line select signal line 151 is converted negatively so that the TFTs 153 and 154 turn off. Since the potential of the gate signal line 157 is still positive, the TFT 155 is in the on-state. Then, because the TFT at that time mainly functions as an electrostatic capacity, the potential of the source and the drain of the TFT 155 is nearly the same as that of the pixel cell 156 (period c in FIG. 11B).

Then, when the potential of the gate signal line 157 is converted negatively, the electrostatic capacity formed in the TFT 155 becomes rapidly decreased. Then, in order to hold the charges (which are difficult to flow out to another place since the TFTs 153 and 154 are in the off-state) stored in the TFT 155, a voltage between the source and the drain of the TFT 155 is increased (its absolute value is increased). In other words, a region having a very high voltage is formed with the center of the TFT 155, and even though the potential of the image signal line is converted negatively because of that region, the potential of the TFT 155 is lowered with priority, and the charges are restrained from flowing out from the pixel cell 156, and the potential is restrained from dropping.

Conversely, a current flows toward the pixel cell 156 from the TFT 155 because of the potential difference. Even though all of the charges stored in the TFT 155 flow in the pixel cell, the potential of the pixel cell hardly fluctuates from the viewpoint of the ratio of the charges stored in the TFT 155 to the electrostatic capacity of the pixel cell. With the above-mentioned operation, the off-state current can be reduced (periods d and e in FIG. 11B). Subsequently, the same operation is repeated.

As described above, the present invention has an effect that the off-state current can be reduced in average. In addition, the possibility of generating the switching element (a defective switching element) having a large off-state current can be remarkably reduced. For example, in FIG. 10A, even though one of the TFTs 153 and 154 has a very large off-state current, if the other is normal, the off-state current restraint effect is exhibited as a whole. In other words, the possibility that both of the TFTs 153 and 154 are of defective ones having a large off-state current is very low. As a result, the off-state current is 1 pA or less for 99% of the switching element TFTs, and is 10 pA or less for 99.99% of the switching element TFTs. Thus, the possibility of generating the switching element of 100 pA or more which gives an image a fault could be restrained to 1 ppm or less.

It should be noted that if an LDD region or an offset region is formed in the channels of the TFTs 153 and 154, those regions are made a drain resistor and a source resistor with the results that the electric field intensity of the drain junction is relieved to further reduce the off-state current. In particular, it is effective that an LDD (low density doping)

region or an offset region is formed on both ends of the channel of the TFT 104 at a pixel electrode side.

Figure 10A:
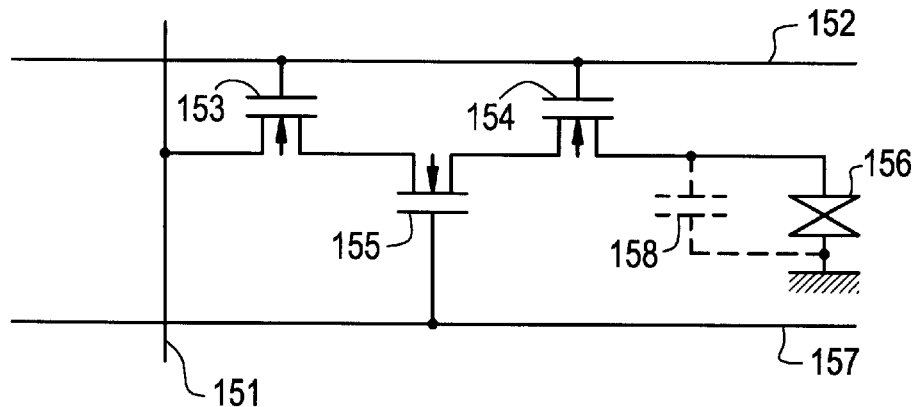
FIGS. 10A to 10C show examples of a switching element in an active matrix circuit in accordance with the present invention.
Figure 10B:
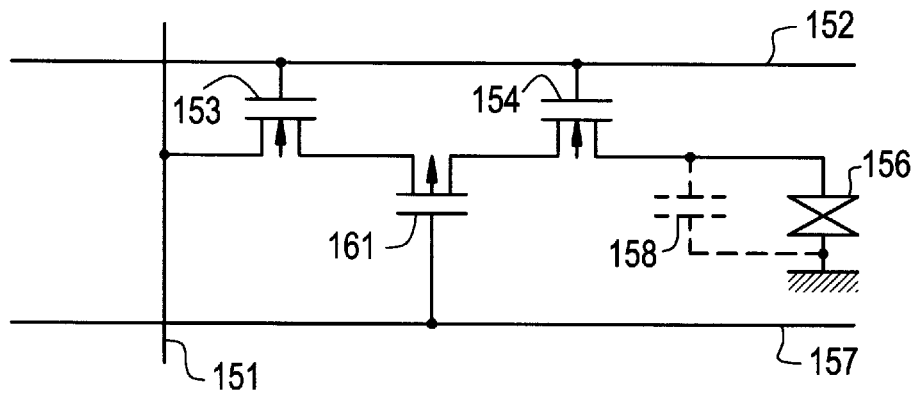

In the example shown in FIG. 10A, the center TFT 155 is of the same conduction type (in this case, the n-channel type) as that of the TFTs 153 and 154 on both ends thereof. Alternatively, as shown in FIG. 10B, it may be of a TFT 161 (that is, the p-channel type) of the conduction type reverse to that of the TFT 155. In this case, a signal applied to the gate electrode of the center TFT 111 is reverse to that in the case of FIG. 10A (FIG. 10B).

Figure 10C:
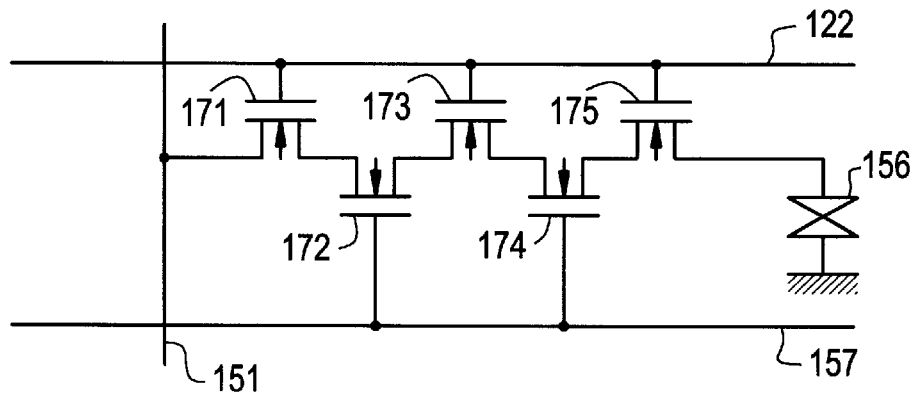

Also, more TFTs may be connected in series. For example, as shown in FIG. 10C, five TFTs 171 to 175 may be connected in series to constitute a circuit. In the case of FIG. 10C, because five TFTs are used in total, the off-state current reduction effect is further increased. However, if the number of the TFTs as used is increased to seven, nine . . . , the off-state current reduction effect is not increased so much. The number of the TFTs as used is preferably 5 or less in view of the circuit construction, etc.

Third Embodiment

Figure 1C:
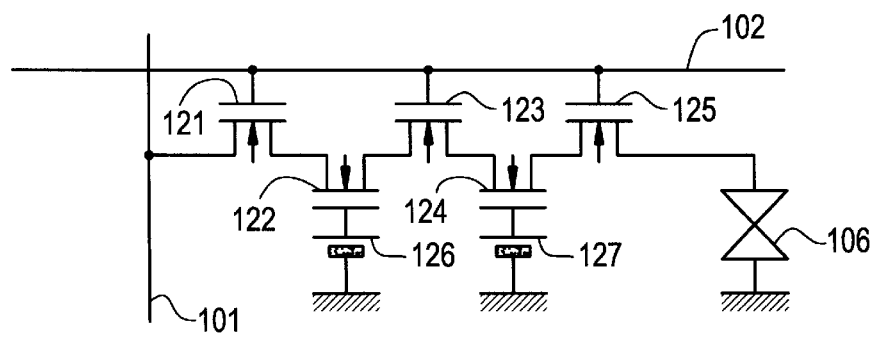
Figure 1D:
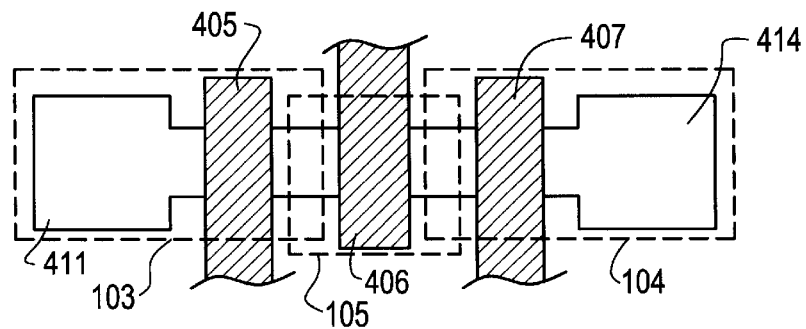

The switching element in the active matrix in accordance with the first and second embodiments shown in FIGS. 1A and 10A may be constituted as shown in FIG. 1D. However, if the switching element is constituted as shown in FIG. 3, an occupied area can be reduced. The arrangement shown in FIG. 3 will be described.

Figure 3A:
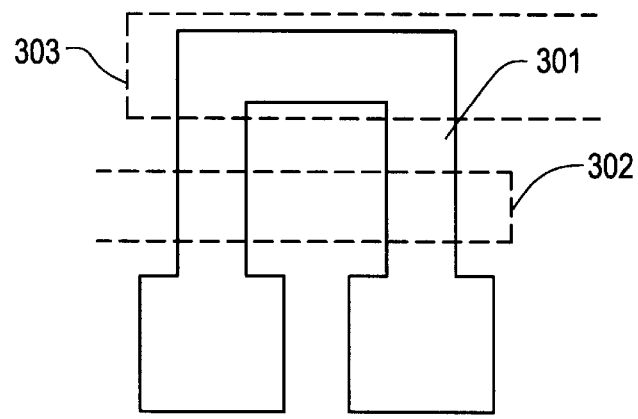
FIGS. 3A to 3C show examples of arrangements of a semiconductor region and gate of the switching element in an active matrix circuit in accordance with a third embodiment of the present invention.

First, a crystalline silicon semiconductor film 301 which is substantially longitudinal U-shaped, lateral U-shaped or horseshoe-shaped is formed. The semiconductor film is crystallized using a catalyst element, and it typically contains the catalyst element of $1 \times 10^{15}$ to $1 \times 10^{19}$ atoms/cm$^3$ (FIG. 3A).

Figure 3B:
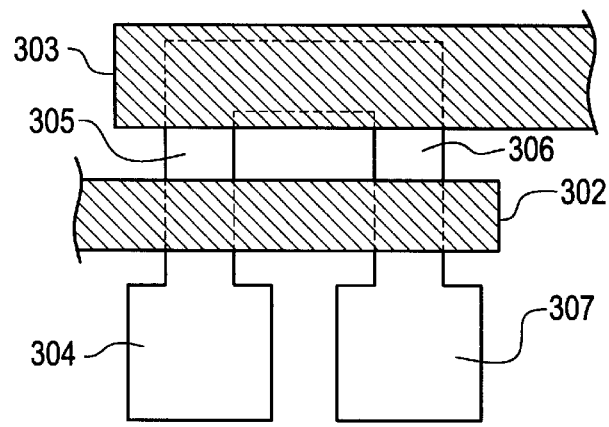

A line select signal line 302 and a capacity line (gate signal line) 303 are disposed on the semiconductor film as shown in FIG. 3B. In other words, the semiconductor film 301 has two intersections with the line select signal line 302 and one intersection with the capacity line (gate signal line) 303. The capacity line (gate signal line) 303 is formed on the matrix so as to be in parallel to the line select signal line 302, and is held to a constant voltage. As a result, the TFT formed by the semiconductor film 301 and the capacity line (gate signal line) 303 mainly functions as a static capacity and resistor. This corresponds to the TFT 105 in FIG. 1A.

On the other hand, two intersecting portions which are formed by the line select signal line 302 and the semiconductor film 301 correspond to the TFTs 103 and 104 in FIG. 1A. A region 304 corresponding to the source of the TFT 103 and a region 307 corresponding to the drain of the TFT 104 are formed by doping the semiconductor film 301 with the n-type (or p-type) impurity with a mask of the line select signal line 302 and the capacity line (gate signal line) 303. Those regions 304 and 307 are connected to the image signal line and the pixel electrode.

Also, a region 305 corresponding to the drain of the TFT 103 and a region 306 corresponding to the source of the TFT 104 are also formed.

Figure 3C:
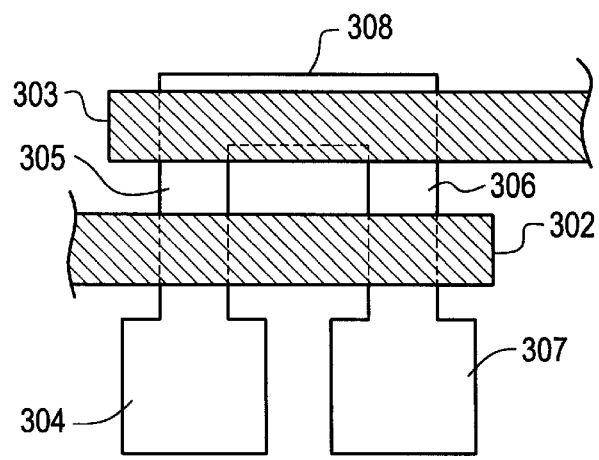

In other words, the semiconductor region is formed with a region which is in contact with said image signal line, a region which is in contact with the pixel electrode, and two regions which are separated by the line select signal lines and the capacity lines (gate signal lines) and exhibit n-type (or p-type) conduction type. It should be noted that there arises no problem even though the capacity line (gate signal line) 303 and the semiconductor film 301 are not perfectly superimposed on each other as shown in FIG. 3C, in such a manner that the semiconductor film 301 has a region 308 partially projecting from the capacity line 303. What is required is that the regions 305 and 306 are completely separated from each other by the capacity line (gate signal line 303) and the line select signal line 302.

As described above, the integrated degree of the circuit can be improved by mainly devising the shape of the semiconductor film (active layer). If the switching element having five TFTs as shown in FIG. 1C is formed, the semiconductor film may be substantially N-shaped or S-shaped so that the capacity line or the line select signal line is superimposed on the semiconductor film.

Fourth Embodiment

A fourth embodiment is directed to a process of manufacturing the circuits described in the first and second embodiments. In this embodiment, the gate electrode is anodically oxidized to form an offset gate with the result that the off-state current is more reduced. It should be noted that a technique for anodically oxidizing the gate electrode is disclosed in Japanese Patent Unexamined Publication No. Hei 5-267667.

FIGS. 4A to 4D show a process of manufacturing the switching element in accordance with this embodiment. First, an oxide silicon film 402 having 1000 to 5000 Å, for example, 3000 Å was formed as an underlaying film on a substrate 401 (Corning 7059, 100 mm×100 mm). The silicon oxide film 402 was formed by decomposing and depositing TEOS through the plasma CVD technique. This process may be conducted through the sputtering technique.

Thereafter, an amorphous silicon film having 300 to 1500 Å, for example, 500 Å was deposited through the plasma CVD technique or the LPCVD technique, and then was crystallized through the thermal annealing technique. In this situation, a little amount of nickel was added as a catalyst element for crystallization in accordance with the technique disclosed in Japanese Patent Unexamined Publication No. Hei 6-144204. As a method of adding nickel, nickel acetate solution of 1 ppm was coated on the amorphous silicon film on which a thin oxide silicon film is formed and then dried. Thereafter, it was left in the atmosphere of 550° C. for four hours.

It should be noted that the optical annealing such as the laser irradiation may be added after the above-mentioned thermal annealing process has been conducted, to further improve the crystalline property. Then, the silicon film thus crystallized was etched to form an island-like region 403. Furthermore, a gate insulating film 404 was formed thereon. In this example, an oxide silicon film having a thickness of 700 to 1500 Å, for example, 1200 Å was formed through the plasma CVD technique. This process may be conducted through the sputtering technique.

Figure 4A:
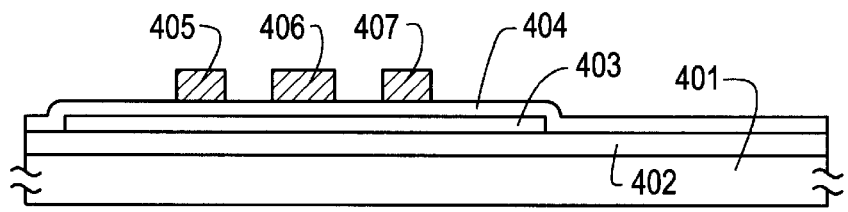
FIGS. 4A to 4E show a process of manufacturing a switching element in an ative matrix circuit in accordance with a fourth embodiment of the present invention.

Thereafter, an Si film containing aluminum of 1 wt % (or containing Sc of 0.1 to 0.3 wt %) with a thickness of 1000 Å to 3 μm, for example, 5000 Å was formed through the sputtering technique. The film thus formed was etched to form the gate electrodes 405, 406 and 407 (FIG. 4A).

Subsequently, the gate electrodes 405 to 407 were anodically oxidized by passing a current through the gate electrodes in an electrolyte, to thereby form an anodic oxide having a thickness of 500 to 2500 Å, for example, 2000 Å. The electrolyte as used was obtained by diluting L-tartaric acid with ethylene glycol to the density of 5%, and by adjusting pH to 7.0±0.2 using ammonia. The substrate was immersed in the electrolyte, and the plus side of a constant current source was connected to the gate electrode on the substrate whereas the minus side thereof was connected to a platinum electrode. A voltage was applied in a constant current state of 20 mA, and oxidation was continued until a voltage becomes 150 V. Further, the oxidation is continued at a constant voltage of 150 V until the current becomes 0.1 mA or less. As a result, aluminum oxide films 408, 409 and 410 having a thickness of 2000 Å were obtained.

Figure 4B:
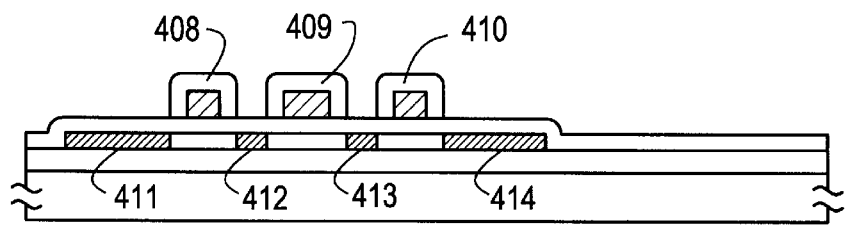

Thereafter, impurities (phosphorus in this example) were injected in the island-like region 403 in the self-matching fashion with a mask of the gate electrode portion (that is, the gate electrodes 405 to 407 and the anodic oxide films 408 to 410 therearound) through the ion doping technique, to thereby form an n-type impurity region. Phosphine ($PH_3$) was used as a doping gas. The dose amount in this case was $1\times10^{14}$ to $5\times10^{15}$ atoms/cm$^2$, an accelerating voltage was 60 to 90 kV, for example, the dose amount was $1\times10^{15}$ atoms/cm$^2$ and the accelerating voltage was 80 kV. As a result, n-type impurity regions 411 to 414 were formed. The state of the element in this stage, viewed from the upper is shown in FIG. 1D (FIG. 4B).

Furthermore, the impurity regions 411 to 414 thus doped were activated by the irradiation of a KrF excimer laser beam (a wavelength of 248 nm, a pulse width of 20 nsec). The proper energy density of the laser beam was 200 to 400 mJ/cm$^2$, preferably 250 to 300 mJ/cm$^2$. This process may be conducted through the thermal annealing. In particular, since the impurity regions contain a catalyst element (nickel) therein, they can be activated through the thermal annealing at a lower temperature than that in the usual case (refer to Japanese Patent Unexamined Publication No. Hei 6-267989). The n-type impurity regions were formed in this manner. In this embodiment, it is found that the impurity regions 411 to 414 are far from the gate electrodes 404 to 407 by the thickness of the anodic oxide films 408 to 410, that is, form an offset gate.

Figure 4C:
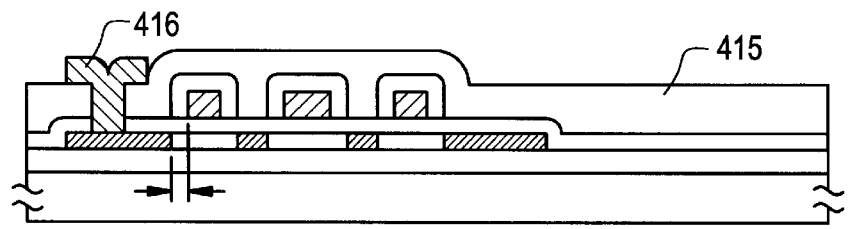

Then, as an interlayer insulating film, a silicon oxide film 415 having a thickness of 5000 Å was formed through the plasma CVD technique. In this case, TEOS and oxygen were used as a raw gas. Then, an interlayer insulating film 415 and the gate insulating film 404 were etched to form a contact hole in the n-type impurity region 411. Thereafter, an aluminum film was formed through the sputtering technique and then etched to form the source electrode and wiring 416. This is an extension of an image signal line (FIG. 4C).

Thereafter, a passivation film 417 was formed. In this example, a silicon nitride film having a thickness of 2000 to 8000 Å, for example, 4000 Å was formed through the plasma CVD technique using a mixture gas of $NH_3/SiH_4/H_2$. Subsequently, a passivation film 417, the interlayer insulating film 415 and the gate insulating film 404 were etched so as to form a contact hole of the pixel electrode in the n-type impurity region 414. Then, an indium tin oxide (ITO) film was formed through the sputtering technique and then etched, to thereby form a pixel electrode 418.

In this way, three TFTs 421, 420 and 422 connected in series were formed. A constant positive voltage is applied to gate electrode 406 of the TFT 420 is that the TFT 420 can be used as a static capacity and resistor as in the TFT 105 of the first embodiment shown in FIG. 1A.

Figure 4D:
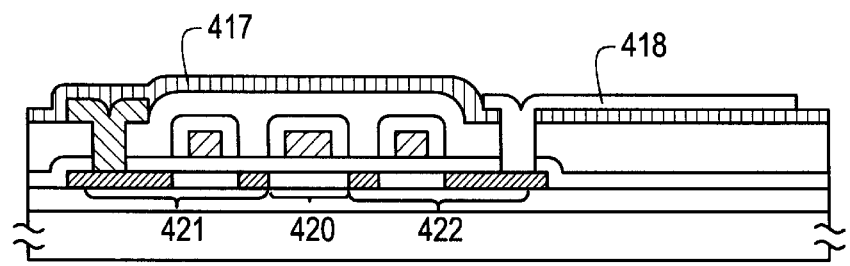

Alternatively, if the gate electrodes 405 and 407 of the TFTs 421 and 422 are so designed as to be supplied with signals from the line select signal line, and the gate electrode 406 of the TFT 420 is so designed as to be supplied with a signal from the gate signal line, then it can be used as the switching element in the second embodiment (FIG. 4D)

Figure 4E:
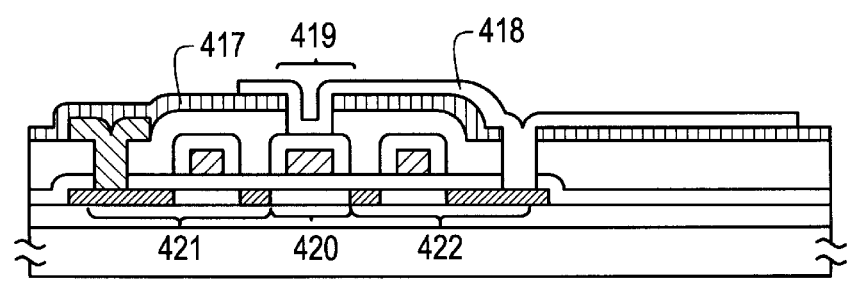

It should be noted that a contact hole may be also formed in the gate electrode 406 simultaneously when a contact hole of the pixel electrode is formed in the n-type impurity region 414 by etching the passivation film 417, the interlayer insulator 418 and the gate insulating film 404 on the gate electrode 406, as s hown in FIG. 4E. Since the anodic oxide (aluminum oxide) is very low in etching speed in the hydrofluoric acid base etchant which etches silicon oxide, the etching is substantially stopped by the anodic oxide 409.

Then, a pixel electrode 418 is formed so as to cover the holes thus formed, and the pixel electrode 418 is opposed to the gate electrode 406 through the anodic oxide film 409 to thereby form a capacity 419. This capacity corresponds to the auxiliary capacity 108 in FIG. 1A, and the capacity can be thus added without increasing the opaque portion of the pixel electrode (that is, without lowering the aperture ratio) (FIG. 4E).

Fifth Embodiment

FIG. 5 shows a process of a fifth embodiment. First, an underlaying silicon oxide film 502 (a thickness of 2000 Å) was deposited on a substrate 501, and nickel was used as a catalyst element as in the fourth embodiment. Then, an island-like region 503 is formed by a crystalline silicon film which has been crystallized by the thermal annealing at 550° C. for four hours. Further, a gate insulating film 504 is formed thereon.

Figure 5A:
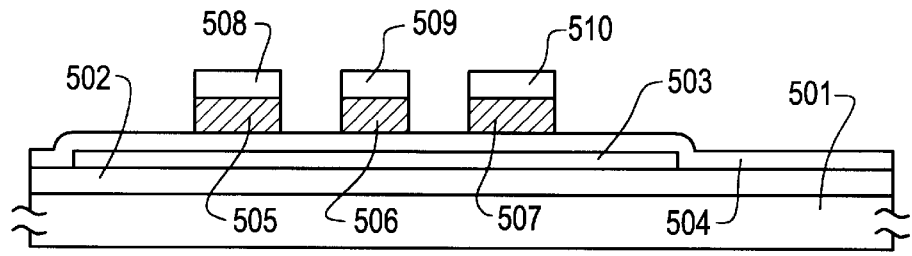
FIGS. 5A to 5E show a process of manufacturing a switching element in an active matrix circuit in accordance with a fifth embodiment of the present invention.

Thereafter, an aluminum film having a thickness of 5000 Å is formed through the sputtering technique. Further, in order to improve an adhesion to a photoresist in a process of forming a porous anodic oxide film which will be conducted later, a thin anodic oxide film having a thickness of 100 to 400 Å may be formed on the surface of the aluminum film. Subsequently, a photoresist having a thickness of 1 μm degree is coated on the film through the spin coating technique, to thereby form masks 508, 509 and 510 of the photoresist. Then, the gate electrodes 505, 506 and 507 are formed by etching through the known photolithgraphy technique. The masks 508, 509 and 510 of the photoresist remain on the gate electrodes 505 to 507 (FIG. 5A).

Figure 5B:
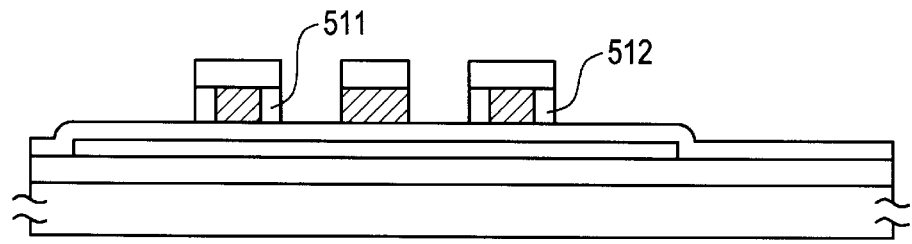

Sequentially, the substrate was immersed in 10% oxalic acid aqueous solution, and the plus side of a constant current source was connected to the gate electrodes 505 and 507 on the substrate whereas the minus side thereof was connected to a platinum electrode, to thereby conduct anodic oxidation. This technique is disclosed in Japanese Patent Unexamined Publication No. Hei 6-338612. In other words, porous anodic oxides 511 and 512 having a thickness of 5000 Å were formed on the side surfaces of the gate electrodes 505 and 507 by conducting anodic oxidation at a constant voltage of 5 to 50 V, for example, 8 V, for 10 to 500 minutes, for example, 200 minutes. The anodic oxides 511 and 510 thus obtained were porous. The anodic oxidation hardly progressed on the upper surface of the gate electrodes 505 and 507 because the masks 508 and 512 existed. Also, since a current did not flow in the gate electrode 506, the anodic oxide was not formed (FIG. 5B).

Thereafter, the upper surfaces of the gate electrodes 505 to 507 were exposed by removing the mask material therefrom. Then, as in the fourth embodiment, the electrolyte as used was obtained by diluting L-tartaric acid with ethylene glycol to the density of 5%, and by adjusting pH to 7.0±0.2 using ammonia. A current flows in the gate electrodes 505, 506 and 507 in the electrolyte so as to be anodically oxidized, thereby forming an anodic oxide having a thickness of 500 to 2500 Å, for example, 2000 Å. As a result, fine (or dense) aluminum oxide films 513, 514 and 515 having a thickness of 2000 Å were obtained.

Figure 5C:
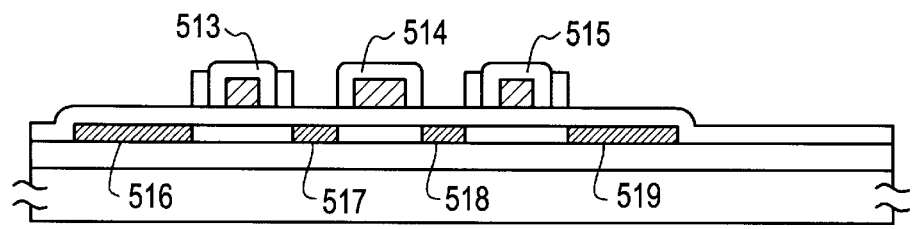

Thereafter, impurities (phosphorus in this example) were self-matchingly injected in the island-like region 503 with a mask of the gate electrode portion through the ion doping technique, to thereby form a p-type impurity region. Diborane ($B_2H_6$) was used as a doping gas. The dose amount in this case was $1\times10^{14}$ to $5\times10^{15}$ atoms/cm$^2$, an accelerating voltage was 40 to 90 kV, for example, the dose amount was $1\times10^{15}$ atoms/cm$^2$ and the accelerating voltage was 65 kV. As a result, p-type impurity regions 516 to 519 were formed (FIG. 5C).

Furthermore, the impurity regions 516 to 519 thus doped were activated by the irradiation of a KrF excimer laser beam (a wavelength of 248 nm, a pulse width of 20 nsec). As described in the fourth embodiment, this process may be conducted through the thermal annealing.

Figure 5D:
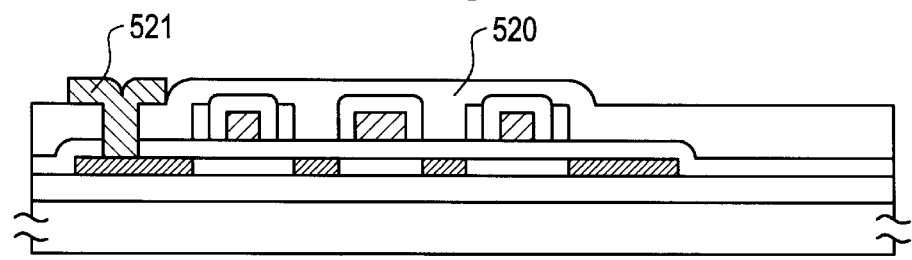

Then, as an interlayer insulating film, a silicon oxide film 520 having a thickness of 3000 Å was formed through the plasma CVD technique. Then, an interlayer insulating film 520 and the gate insulating film 504 were etched to form a contact hole in the p-type impurity region 516. Thereafter, an aluminum film was formed through the sputtering technique and then etched to form an image signal line 521 (FIG. 5D).

Figure 5E:
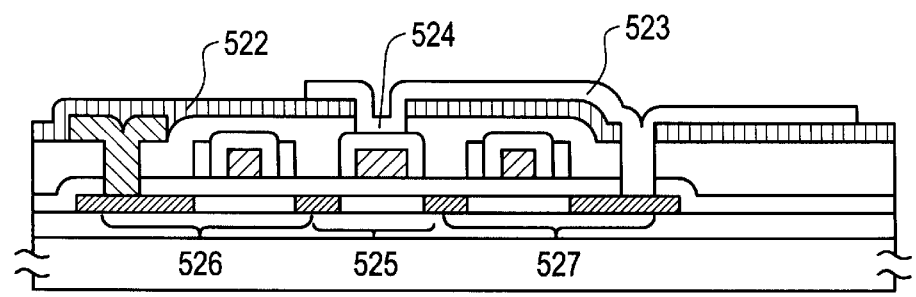

Thereafter, a passivation film 522 was formed, and the passivation film 522, the interlayer insulating film 520 and the gate insulating film 504 were etched so as to form an opening on the anodic oxide film 514 and a contact hole of the pixel electrode in the p-type impurity region 519. Then, an ITO film was formed through the sputtering technique and then etched, to thereby form a pixel electrode 523. The pixel electrode 523 is opposed to the gate electrode 506 with the anodic oxide film 514 as a dielectric to thereby form an auxiliary capacity 524, as in FIG. 4E (FIG. 5E).

With the above-described process, the switching element of the active matrix circuit having the p-channel thin-film transistors 526, 527 and 525 and the auxiliary capacity 524 was formed. In this embodiment, the conduction type of the transistor is reverse but the same as the circuit shown in FIG. 1A or 10A.

In this embodiment, as to the thin-film transistors 526 and 527 which are required to restrain the off-state current, their offset width is made larger than that in the fourth embodiment. On the other hand, since no offset is required in the MOS capacity, the offset is made small.

Sixth Embodiment

FIG. 6 shows a state in which a circuit is formed in accordance with the present invention. A specified process could be made using the known art (or the technique described in the third and fourth embodiments), and therefore it is not described in detail.

Figure 6A:
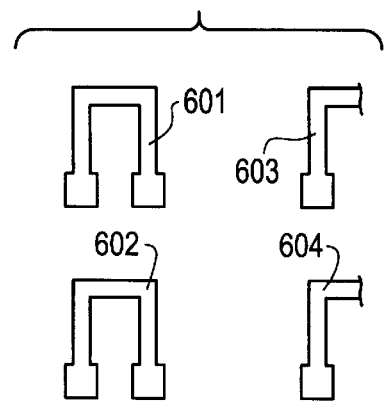
FIGS. 6A to 6F show a process of manufacturing a switching element in an active matrix circuit in accordance with a sixth embodiment of the present invention.

First, an amorphous silicon film is crystallized using a catalyst element by the means described in the fourth embodiment and then etched, to thereby form semiconductor regions (active layers) 601 to 604 which are substantially U-shaped (or laterally U-shaped or horseshoe-shaped). In this example, when the active layer 601 is referenced, the active layer 602 means the same column and the next line, the active layer 603 means the next column and the same line, and the active layer 604 means the next column and the next line (FIG. 6A).

Figure 6B:
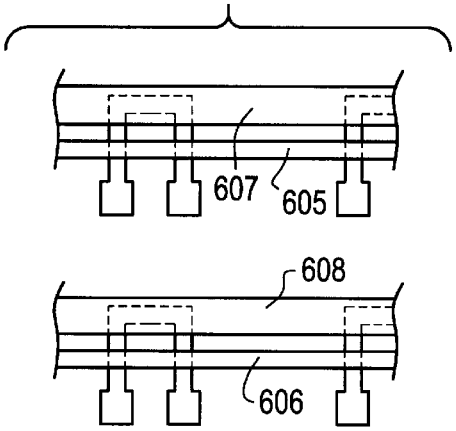

Thereafter, a gate insulating film (not shown) is formed, and further the same film is etched, to thereby form the line select signal lines 604 and 606 and the capacity lines (gate signal lines) 607 and 608. In this example, the positional relationship of the line select signal lines 605, 606, the capacity lines (gate signal lines) 607, 608, and the active layers 601 to 604 is the same as that in FIG. 3 (FIG. 6B).

Figure 6C:
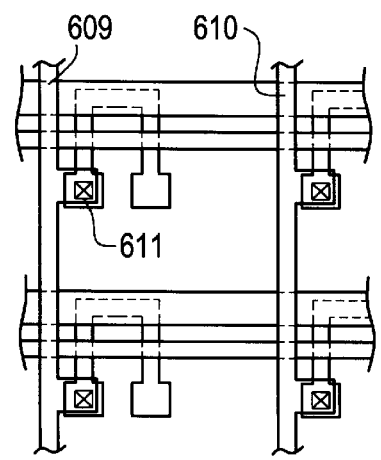

Then, after the active layer has been doped, a contact hole (for example, represented by reference numeral 611) was formed at the left end of the respective active layers, and the image signal lines 609 and 610 were further formed (FIG. 6C).

Figure 6D:
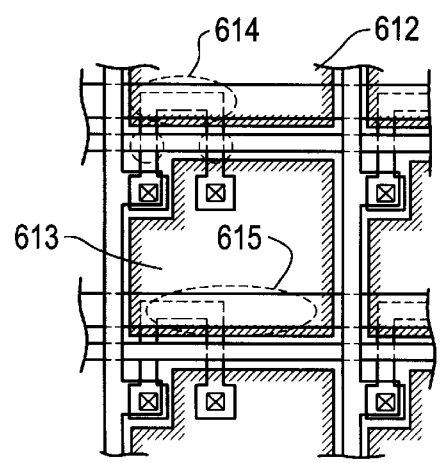

Thereafter, pixel electrodes 612 and 613 were formed in a region surrounded by the line select signal lines 605 and 606 and the image signal lines 609 and 610. In this way, in the capacity line (gate signal line) 607 and the active layer 601, the TFT 614 (=a static capacity and resistor) was formed. In this situation, the capacity line (gate signal line) is so designed as to be superimposed not on the pixel electrode 613 of a line in question but on the pixel electrode 612 at a line upper than the line in question by one line. That is, from the viewpoint of the pixel electrode 613, a one-lower line (gate signal line) 608 is superimposed on the pixel electrode 613, to thereby form the capacity 615. In the case of using the circuit of this embodiment as the circuit of the first embodiment, it is needless to say that the capacity lines 607 and 608 are held a constant potential. Alternatively, in the case of using the circuit of this embodiment as the circuit of the second embodiment, the capacity lines (gate signal lines) 607 and 608 are supplied with a pulse signal which is synchronized with the line select signal lines 605 and 606, but it is held a constant voltage for almost of time (FIG. 6D).

Figure 6E:
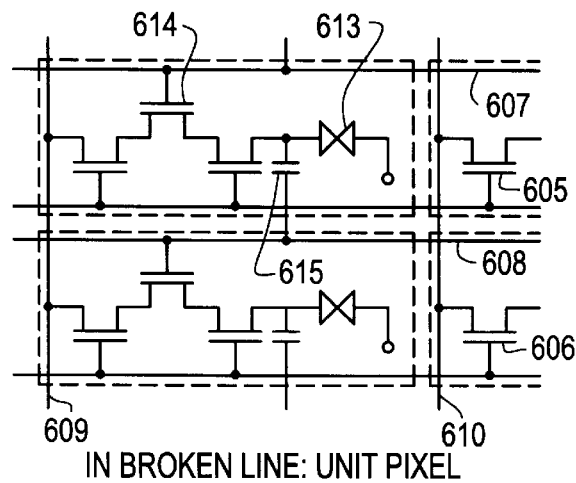
Figure 6F:
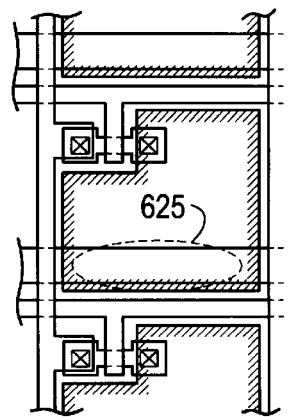

In this way, the capacity line (gate signal line) is so designed as to be superimposed on the pixel electrode of a line upper (or lower) than a line in question by one line, to thereby form the circuit shown in FIG. 6E. The capacity 615 corresponds to the capacity 158 of FIG. 10A, and the capacity can be added without substantially lowering the opening degree (aperture ratio), which is effective in an improvement of the integrated degree of the circuit. FIG. 6F shows a conventional unit pixel (refer to FIG. 12A) which is formed in a region surrounded by the line select signal lines and the image signal lines at the same intervals. The region interrupted by the auxiliary capacity 625 is the same as that in this embodiment (FIG. 6D). In this embodiment, because the semiconductor region 601 is structured so as to be almost covered with the line select signal lines 605 and 607, the opening degree (aperture ratio) could not be reduced. Conversely, in the conventional circuit (FIG. 6F), the lowering of the opening degree (aperture ratio) is recognized by the gate electrode separated from the line select signal line.

Seventh Embodiment

A seventh embodiment is characterized by an active matrix electro-optical display device, which comprises:

a pair of pixel electrodes 707 and 708;

a pair of line select signal lines 702 and 706 disposed between said pair of pixel electrodes;

a capacity line 703 disposed between said line select signal lines; and two thin-film transistors disposed for each of said pair of pixel electrodes;

wherein the active layers 705 and 706 of said thin-film transistors have one crystalline silicon semiconductor film which is substantially longitudinal U-shaped, lateral U-shaped or horseshoe-shaped;

wherein said pair of line select signal lines 702 and 704 are disposed so as to correspond to the active layers of the thin-film transistors; and wherein said capacity line 703 is disposed commonly with the active layers 705 and 706 of said respective thin-film transistors.

Also, an active matrix electro-optical display device according to this embodiment, comprises:

a pair of pixel electrodes 707 and 708;

a pair of line select signal lines 702 and 704 disposed between said pair of pixel electrodes;

a capacity line 703 disposed between said line select signal lines; and a pair of active layers 705 and 706 of thin-film transistors disposed for each of said pair of pixel electrodes;

wherein the active layers 705 and 706 are substantially longitudinal U-shaped, lateral U-shaped or horseshoe-shaped;

wherein one 702 of said pair of line select signal lines is disposed so as to be transverse to one 705 of said pair of active layers;

wherein the other 704 of said pair of line select signal lines is disposed so as to be transverse to the other 706 of said pair of active layers; and wherein said capacity line 703 is disposed so as to be transverse to both of said pair of active layers 705 and 706.

Figure 7:
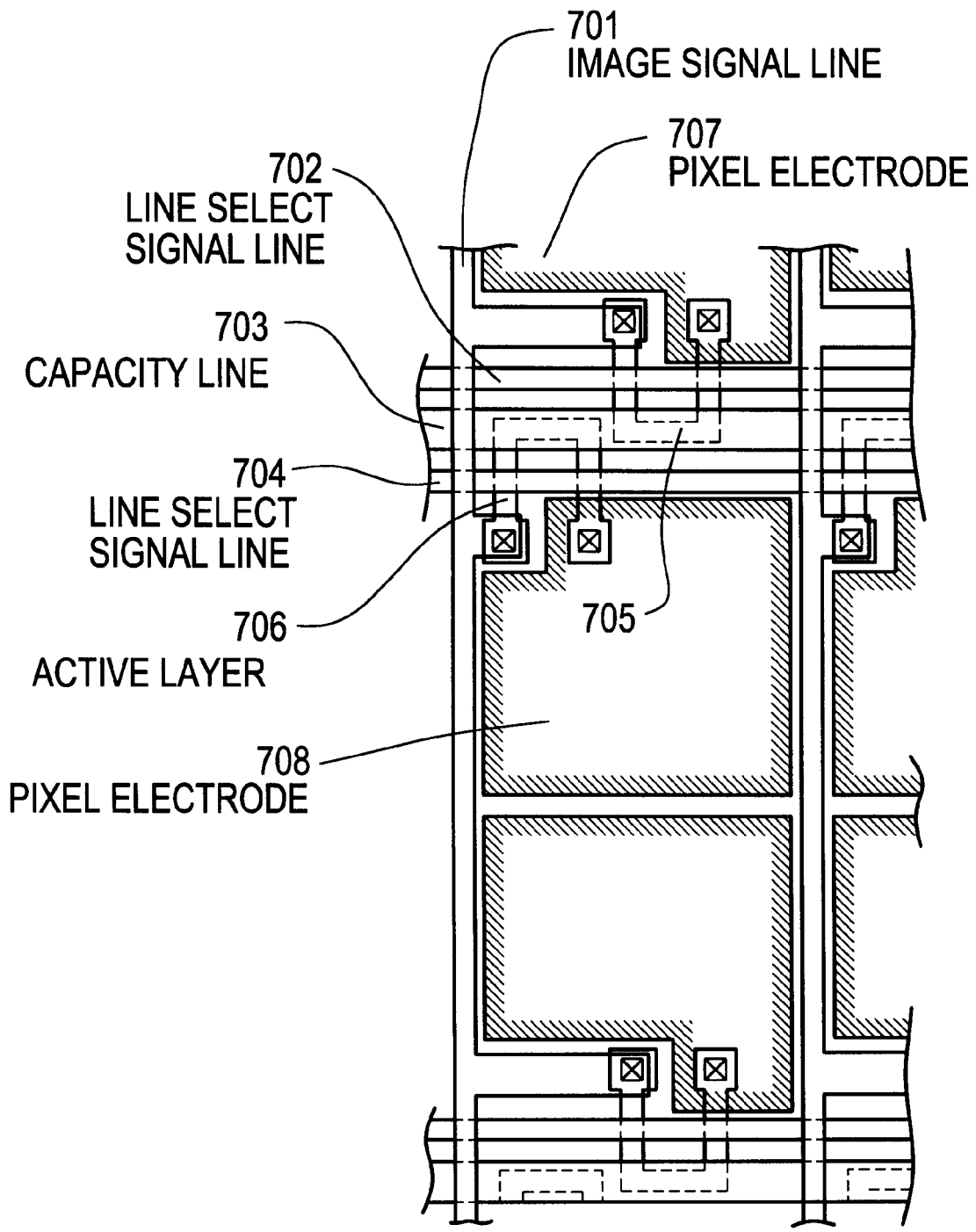
FIG. 7 shows an example of an active matrix circuit.

In this embodiment, in the thin-film transistor group connected to adjacent pixel electrodes, the capacity line is arranged commonly. FIG. 7 shows the schematic structure in accordance with the seventh embodiment.

In the adjacent pixel electrodes 707 and 705 of FIG. 7, the thin-film transistor group which is comprised of the active layer 705 of the horseshoe type is connected to the thin-film transistor group which is comprised of the active layer 706 of the same horseshoe type. Then, the capacity line 703 which is superimposed on the active layers 705 and 706 is commonly arranged.

The respective active layers 705 and 706 cross the gate lines 703 and 704, respectively, to thereby form two thin-film transistors connected in series. One end of the active layers 705 and 706 is connected to the image signal line.

Figure 8:
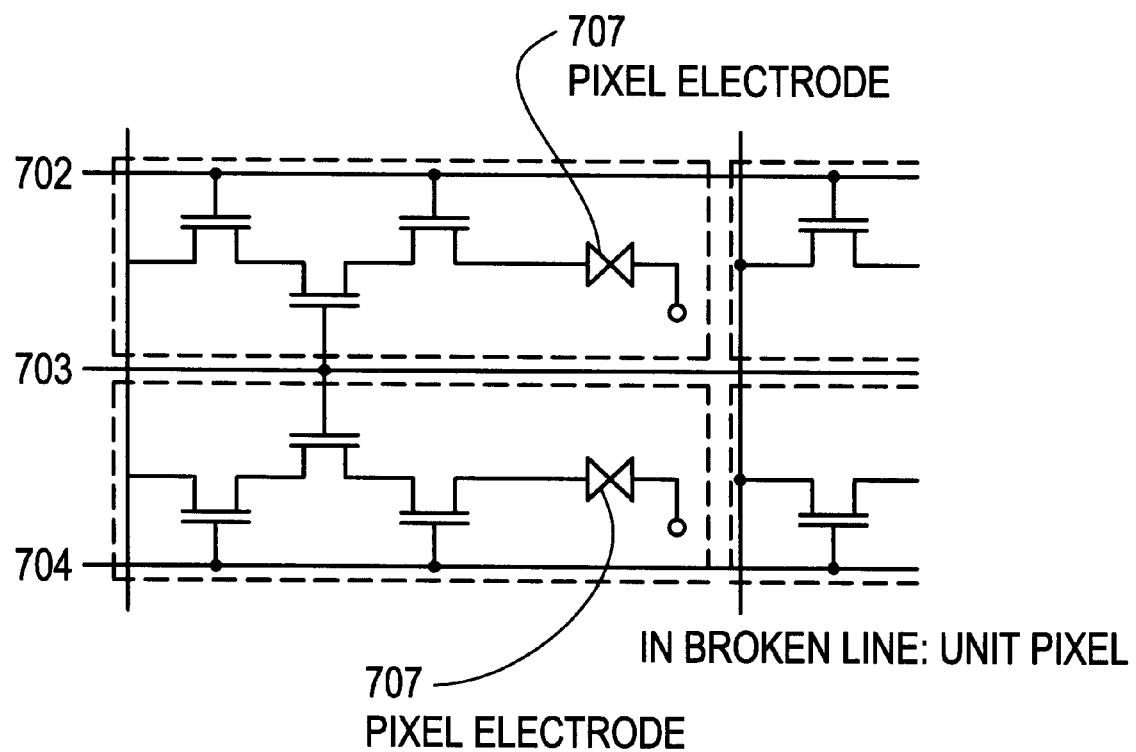
FIG. 8 shows an equivalent circuit of the active matrix circuit shown in FIG. 7.
Figure 9:
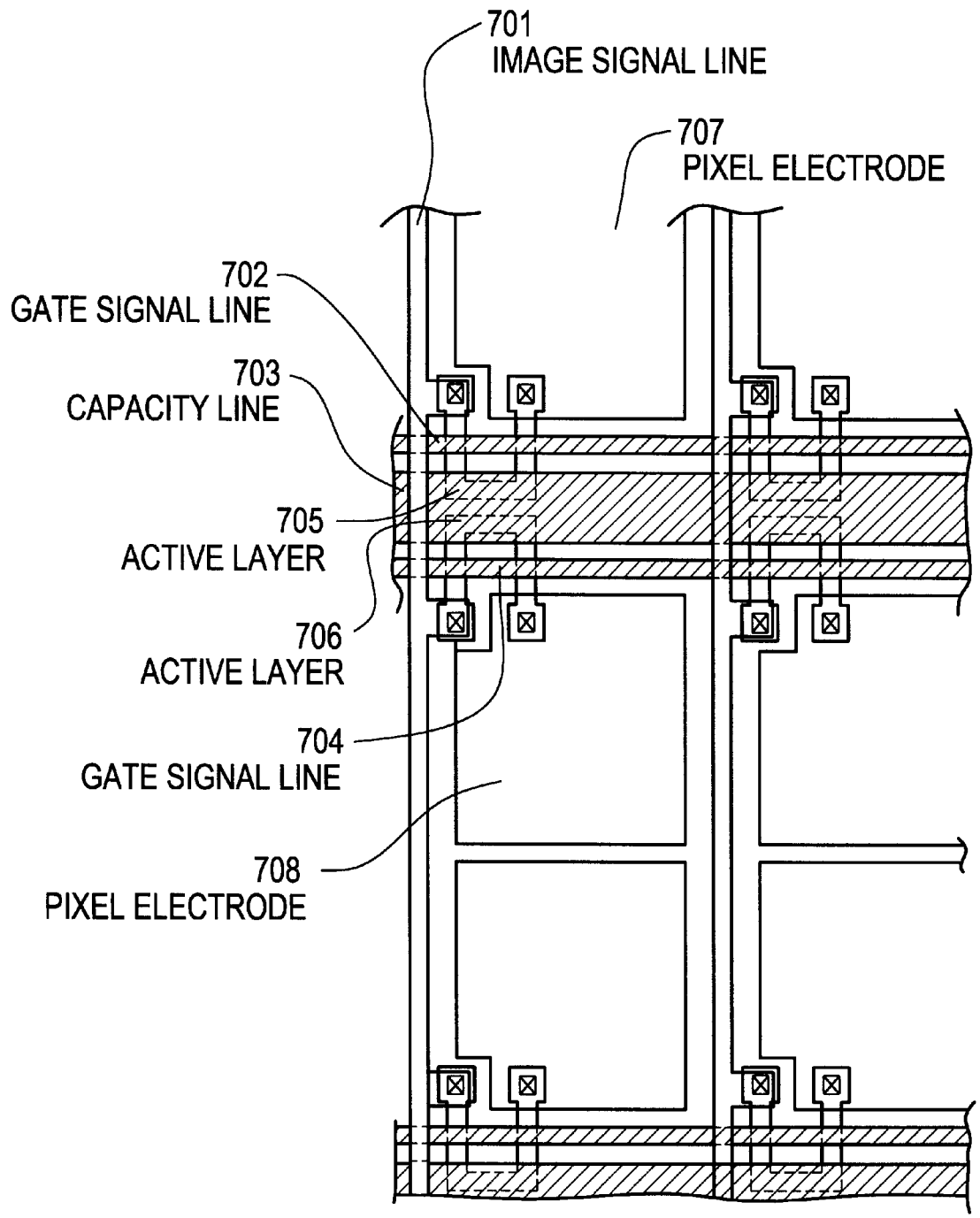
FIG. 9 shows an example of an active matrix circuit.

An equivalent circuit of the structure shown in FIG. 7 is shown in FIG. 8. In the case of applying the structure shown in this embodiment, since the number of capacity lines can be reduced, the opening degree (aperture ratio) of the pixel can be enhanced. It should be noted that FIG. 9 shows an example in which the structure shown in FIG. 7 is modified.

Figure 2C:
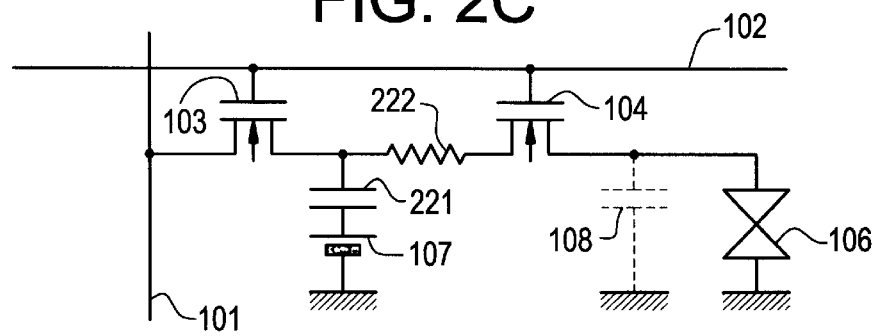
Figure 2D:
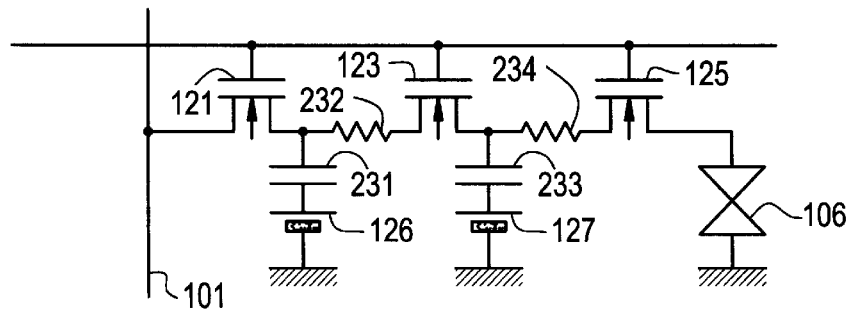

As was described above, according to the present invention, a voltage drop across the liquid-crystal cell can be restrained by connecting a plurality of TFTs in an appropriate manner. In the present invention, a voltage between the source and the drain of the thin-film transistor 222 shown in FIG. 2C is held sufficiently low during all the driving process. In general, since the deterioration of the TFT depends on a voltage between the source and the drain thereof, such a deterioration can be prevented by the application of the present invention.

The present invention is effective in uses where a higher-degree image display is required. In other words, in the case of representing an extremely fine shading of more than 256 gradations, it is necessary to restrain the discharge of the liquid-crystal cell to 1% or less for one frame. Any conventional systems could not achieve this object.

It should be noted that although the liquid-crystal electro-optical display device was mainly described in the above, the active matrix circuit of the present invention is not limited by or to the liquid-crystal electro-optical display device. It is apparent that the present invention is also applicable to a display unit using an electro-luminescence (EL) and a display unit using plasma emission (plasma display=PDP) since it is required to hold a voltage. Hence, the present invention is useful in the industrial view.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An active matrix electro-optical device comprising:

a pixel electrode disposed in a matrix which is constituted so that image signal lines are substantially orthogonal to line select signal lines; and a switching element circuit comprising at least three TFTs connected in series to said pixel electrode, at least one of said TFTs except for the TFT connected to one of said image signal lines and the TFT connected to said pixel electrode being connected to a gate signal line at a gate electrode of said at least one of said TFTs to turn on said at least one of said TFTs during a period containing one entire period of turning on the TFT connected to one of said image signal lines and the TFT connected to said pixel electrode;

wherein active layers of the TFTs are made of crystalline silicon and contains a catalyst element that promotes the crystallization of silicon at $1 \times 10^{15}$ to $1 \times 10^{19}$ atoms/cm$^3$.

2. The device of claim 1 wherein LDD regions are disposed to both ends of a channel of the thin-film transistor connected to said pixel electrode.

3. The device of claim 1 wherein offset regions are disposed to both ends of a channel of the thin-film transistor connected to said pixel electrode.

4. An active matrix electro-optical device comprising:

a pixel electrode arranged in the form of a matrix;

a switching element circuit comprising at least three TFTs connected in series to said pixel electrode;

at least three gate electrodes of said at least three TFTs disposed on a crystalline silicon semiconductor film in the form of one islland which is provided for each pixel electrode, wherein said semiconductor film contains a catalyst element that promotes the crystallization of silicon at $1 \times 10^{15}$ to $1 \times 10^{19}$ atoms/cm$^3$ and has n-type or p-type regions which have been doped using said gate electrodes as masks and are series connected to each other, wherein one of ends of the series connected n-type of p-type regions disposed in said sewmiconductor film is connected to said pixel electrode and the other therof is connected to an image signal line, and wherein at least one of said TFTs except for the TFT connected to said image signal line and the TFT connected to said pixel electrode being connected to a gate signal line at a gate electrode of said at least one of said TFTs to turn on said at least one of said TFTs during a period containing one entire period of turning on the TFT connected to said image signal line and the TFT connected to said pixel electrode.

5. The device of claim 4 wherein said crystalline silicon semiconductor film is substantially U-shaped, lateral U-shaped or horseshoe-shaped.

6. The device of claim 4 wherein said line select signal line is made of a material mainly containing aluminum, and side surfaces and an upper surface thereof are coated with an anodic oxide.

7. An active matrix electro-optical device comprising:

a pixel electrode arranged in the form of a matrix;

a switching element circuit comprising at least three TFTs connected in series to said pixel electrode;

at least three gate electrodes of said at least three TFTs disposed on a crystalline silicon semiconductor film in the form of one island which is provided for each pixel electrode, said semiconductor film containing a catalyst element that promotes the crystallization of silicon at $1 \times 10^{15}$ to $1 \times 10^{19}$ atoms/cm$^3$ and having n-type or p-type regions which have been doped using said gate electrode as a mask, wherein one of both-end regions of the n-type or p-type regions disposed in said semiconductor region is connected to an image signal line, wherein the first gate electrode at the pixel electrode side and the third gate electrode at the image signal line side are connected to a line select signal line for said pixel electrode; and wherein at least one of said TFTs except for the TFT connected to said image signal line and the TFT connected to said pixel electrode being connected to a gate signal line at a gate electrode of said at least one of said TFTs to turn on said at least one of said TFTs during a period containing one entire period of turning on the TFT connected to said image signal line and the TFT connected to said pixel electrode.

8. The device of claim 7 wherein said crystalline silicon semiconductor film is substantially U-shaped, lateral U-shaped or horseshoe-shaped.

9. The device of claim 7 wherein said line select signal line is made of a material mainly containing aluminum, and side surfaces and an upper surface thereof are coated with an anodic oxide.

10. An active matrix electro-optical device comprising:
a plurality of image signal lines;
a plurality of line select signal lines disposed substantially in perpendicular to said image signal lines;
capacity lines disposed between said line select signal lines in parallel, each of said capacity lines being provided between two of said line select signal lines;
pixel electrodes disposed in regions surrounded by said line select signal lines and said image signal lines; and
a switching element comprising at least three TFTs connected in series to corresponding one of said pixel electrodes,
wherein said switching element has one crystalline silicon semiconductor film which is substantially U-shaped, lateral U-shaped or horseshoe-shaped,
wherein said semiconductor film contains a catalyst element that promotes the crystallization of silicon at $1 \times 10^{15}$ to $1 \times 10^{19}$ atoms/cm$^3$,
wherein said semiconductor film crosses said line select signal lines at at least two points and crosses said capacity lines at at least one point, and
wherein at least one of said TFTs except for the TFT connected to one of said image signal lines and the TFT connected to one of said pixel electrodes being connected to a gate signal line at a gate electrode of said at least one of said TFTs to turn on said at least one of said TFTs during a period containing one entire period of turning on the TFT connected to one of said image signal lines and the TFT connected to one of said pixel electrodes.

11. The device of claim 10 wherein said line select signal lines are made of a material mainly containing aluminum, and side surfaces and an upper surface thereof are coated with an anodic oxide.

12. The device of claim 10 wherein said capacity lines are not superimposed on a pixel of a line in question, but are superimposed on a pixel of a line adjacent to the line in question.

13. An active matrix electro-optical device comprising:
a plurality of image signal lines;
a plurality of line select signal lines disposed substantially in perpendicular to said image signal lines;
capacity lines disposed between said line select signal lines in parallel, each of said capacity lines being provided between two of said line select signal lines;
pixel electrodes disposed in regions surrounded by said line select signal lines and said image signal lines; and
a switching element comprising at least three TFTs connected in series to corresponding one of said pixel electrodes,
wherein said switching element has one crystalline silicon semiconductor film,
wherein said semiconductor film contains a catalyst element that promotes the crystallization of silicon at $1 \times 10^{15}$ to $1 \times 10^{19}$ atoms/cm$^3$,
wherein regions which are in contact with said image signal lines, regions which are in contact with said pixel electrodes, and two or more regions which are separated by said line select signal lines and said capacity lines exhibit the conduction type of the n-type or p-type, and
wherein at least one of said TFTs except for the TFT connected to one of said image signal lines and the TFT connected to one of said pixel electrodes being connected to a gate signal line at a gate electrode of said at least one of said TFTs to turn on said at least one of said TFTs during a period containing one entire period of turning on the TFT connected to one of said image signal lines and the TFT connected to one of said pixel electrodes.

14. The device of claim 13 wherein said line select signal lines are made of a material mainly containing aluminum, and side surfaces and an upper surface thereof are coated with an anodic oxide.

15. The device of claim 13 wherein said capacity lines are not superimposed on a pixel of a line in question, but are superimposed on a pixel of a line adjacent to the line in question.

16. An active matrix electro-optical device comprising:
a pair of pixel electrodes;
a pair of line select signal lines disposed between said pair of pixel electrodes;
a capacity line disposed between said line select signal lines; and
two thin-film transistors disposed for each of said pair of pixel electrodes,
wherein each of the active layers of said thin-film transistor has one crystalline silicon semiconductor film which is substantially U-shaped, lateral U-shaped or horseshoe-shaped,
wherein said pair of line select signal lines are disposed so as to correspond to the active layers of the thin-film transistors, and
wherein said capacity line is disposed commonly with the active layers of said thin-film transistors.

17. An active matrix electro-optical device comprising:
a pair of pixel electrodes;
a pair of line select signal lines disposed between said pair of pixel electrodes;

a capacity line disposed between said line select signal lines; and a pair of active layers of thin-film transistors disposed for each of said pair of pixel electrodes, wherein the active layers are substantially U-shaped, lateral U-shaped or horseshoe-shaped, wherein one of said pair of line select signal lines is disposed so as to be transverse to one of said pair of active layers, wherein the other of said pair of line select signal lines is disposed so as to be transverse to the other of said pair of active layers, and wherein said capacity line is disposed so as to be transverse to both of said pair of active layers.

18. An active matrix electro-optical device comprising:

pixel electrodes and image signal lines disposed in the form of a matrix; and a switching element circuit in which at least three thin-film transistors are connected in series for one of said pixel electrodes, at least one of said thin-film transistors except for thin-film transistor connected to corresponding one of said image signal lines and the TFT connected to corresponding one of said pixel electrodes being connected to a gate signal line at a gate electrode of said at least one of said thin-film transistors to turn on said at least one of said thin-film transistors during a period containing one entire period of turning on the thin-film transistor connected to said corresponding one of said image signal lines and the TFT connected to said corresponding one of said pixel electrode and being controlled by the gate signal line that supplies a signal independent from line select signal lines.

19. The device of claim 18 wherein active layers of said thin-film transistors are made of crystalline silicon, and contain a catalyst element that promotes the crystallization of silicon at $1\times10^{15}$ to $1\times10^{19}$ atoms/cm$^3$.

20. The device of claim 18 wherein the gate signal line is disposed in parallel to the line select signal lines and disposed between the line select signal lines.

21. The device of claim 18 wherein LDD regions are disposed to both ends of a channel of the thin-film transistor connected to said one of said pixel electrodes.

22. The device of claim 18 wherein offset regions are disposed to both ends of a channel of the thin-film transistor connected to said one of said pixel electrodes.

23. An active matrix electro-optical device comprising:

a plurality of image signal lines;

a plurality of line select signal lines disposed substantially in parallel to said image signal lines;

gate signal lines disposed between said line select signal lines in parallel one by one;

pixel electrodes disposed in regions surrounded by said line select signal lines and said image signal lines; and a switching element comprising at least three TFTs connected in series to corresponding one of said pixel electrode, wherein the switching element has one crystalline silicon semiconductor film which is substantially U-shaped, lateral U-shaped or horseshoe-shaped, wherein the switching element has at least two intersections with said line select signal lines and at least one intersection with said gate signal lines, and wherein at least one of said TFTs except for the TFT connected to one of said image signal lines and the TFT connected to one of said pixel electrodes being connected to corresponding one of said gate signal lines at a gate electrode of said at least one of said TFTs to turn on said at least one of said TFTs during a period containing one entire period of turning on the TFT connected to one of said image signal lines and the TFT connected to one of said pixel electrodes.

24. The device of claim 23 wherein said semiconductor film contains a catalyst element that promotes the crystallization of silicon at $1\times10^{15}$ to $1\times10^{19}$ atoms/cm$^3$.

25. The device of claim 23 wherein said line select signal lines are made of a material mainly containing aluminum, and side surfaces and an upper surface thereof is coated with an anodic oxide.

26. The device of claim 23 wherein said gate signal lines are not superimposed on a pixel of a line in question, but are superimposed on a pixel of a line adjacent to the line in question.

27. An active matrix electro-optical device comprising:

a plurality of image signal lines;

a plurality of line select signal lines disposed substantially in parallel to said image signal lines;

gate signal lines disposed between said line select signal lines in parallel one by one;

pixel electrodes disposed in regions surrounded by said line select signal lines and said image signal lines; and a switching element comprising at least three TFTs connected in series to corresponding one of said pixel electrode, wherein said switching element has one crystalline silicon semiconductor film, and wherein regions which are in contact with said image signal lines, regions which are in contact with said pixel electrodes, and two or more regions which are separated by said line select signal lines and said gate signal lines exhibit the conduction type of the n-type or p-type, and wherein at least one of said TFTs except for the TFT connected to one of said image signal lines and the TFT connected to one of said pixel electrodes being connected to corresponding one of said gate signal line at a gate electrode of said at least one of said TFTs to turn on said at least one of said TFTs during a period containing one entire period of turning on the TFT connected to one of said image signal lines and the TFT connected to one of said pixel electrodes.

28. The device of claim 27 wherein said semiconductor film contains a catalyst element that promotes the crystallization of silicon at $1\times10^{15}$ to $1\times10^{19}$ atoms/cm$^3$.

29. The device of claim 27 wherein said line select signal lines are made of a material mainly containing aluminum, and side surfaces and an upper surface thereof is coated with an anodic oxide.

30. The device of claim 27 wherein said gate signal lines are not superimposed on a pixel of a line in question, but are superimposed on a pixel of a line adjacent to the line in question.

* * * * *